US012805105B2

(12) United States Patent
Zhang et al.

(10) Patent No.: US 12,805,105 B2
(45) **Date of Patent: *Nov. 17, 2026**

(54) METHOD FOR PREPARING SOLAR CELL, SOLAR CELL, AND TANDEM SOLAR CELL

(71) Applicants: ZHEJIANG JINKO SOLAR CO., LTD., Haining (CN); JINKO SOLAR CO., LTD., Jiangxi (CN)

(72) Inventors: Yuanfang Zhang, Haining (CN); Menglei Xu, Haining (CN); Jie Yang, Haining (CN); Xinyu Zhang, Haining (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

This patent is subject to a terminal disclaimer.

(21) Appl. No.: 19/266,115

(22) Filed: Jul. 10, 2025

(65) Prior Publication Data

US 2025/0344564 A1 Nov. 6, 2025

Related U.S. Application Data

(63) Continuation of application No. 18/616,205, filed on Mar. 26, 2024, now Pat. No. 12,396,312, which is a (Continued)

(30) Foreign Application Priority Data

Dec. 13, 2022 (CN) ........................ 202211601215.X

(51) Int. Cl.
*H10K 30/35* (2023.01)
*H10F 10/19* (2025.01)
(Continued)

(52) U.S. Cl.
CPC ............. *H10K 30/35* (2023.02); *H10F 10/19* (2025.01); *H10F 19/40* (2025.01); *H10K 30/40* (2023.02); *H10K 71/80* (2023.02); *H10K 85/50* (2023.02)

(58) Field of Classification Search
None
See application file for complete search history.

(56) References Cited

U.S. PATENT DOCUMENTS

2011/0232760 A1 9/2011 Shirata
2017/0098514 A1 4/2017 Geohegan et al.

FOREIGN PATENT DOCUMENTS

CN 110797462 A 2/2020
CN 111952377 A 11/2020
(Continued)

OTHER PUBLICATIONS

Ricciardulli et al., Nature Materials, vol. 20, Oct. 2021, 1325-1336. (Year: 2021).*
(Continued)

*Primary Examiner* — Eli S Mekhlin
(74) *Attorney, Agent, or Firm* — USCH Law, PC

(57) ABSTRACT

A method for preparing a solar cell includes: providing a carrier plate and a separation auxiliary layer, forming a perovskite absorption layer, having a first side facing away from the separation auxiliary layer and a second side opposite to the first side and including a bonding matrix and monocrystal perovskite particles, over the separation auxiliary layer away from the carrier plate, at least some of the monocrystal perovskite particles having first convex surfaces and second convex surfaces protruding from the bonding matrix on the first and second side respectively, and a functional layer formed over a portion of the monocrystal perovskite particles; forming a first carrier transport layer and a first conductive layer sequentially on the first side of
(Continued)

the perovskite absorption layer; removing the carrier plate and the separation auxiliary layer, and forming a second conductive layer on the second side of the perovskite absorption layer.

20 Claims, 10 Drawing Sheets

Related U.S. Application Data continuation of application No. PCT/CN2022/140841, filed on Dec. 21, 2022.

(51) Int. Cl.

| | |
|---|---|
| ***H10F 19/40*** | (2025.01) |
| ***H10K 30/40*** | (2023.01) |
| ***H10K 71/80*** | (2023.01) |
| ***H10K 85/50*** | (2023.01) |

(56) References Cited

FOREIGN PATENT DOCUMENTS

| | | | |
|---|---|---|---|
| CN | 114447127 | A | 5/2022 |
| CN | 115799359 | A | 3/2023 |
| JP | 2015111709 | A | 6/2015 |
| JP | 2025108696 | A | 7/2025 |
| WO | 2020116722 | A1 | 6/2020 |

OTHER PUBLICATIONS

Zhejiang Jinko Solar Co., Ltd. et al., Japan Notice of Grant with English Translation, JP2024-510680, Oct. 27, 2025, 6 pgs.

Zhejiang Jinko Solar Co., Ltd. et al., CN First Office Action with English translation, CN202211601215X, Mar. 20, 2026, 11 pgs.

* cited by examiner

METHOD FOR PREPARING SOLAR CELL, SOLAR CELL, AND TANDEM SOLAR CELL

CROSS-REFERENCE TO RELATED APPLICATIONS

The present application is a continuation of U.S. patent application Ser. No. 18/616,205, filed on Mar. 26, 2024, which is a continuation of PCT Patent Application No. PCT/CN2022/140841, filed Dec. 21, 2022, which claims priority to Chinese Patent Application No. CN202211601215.X, filed on Dec. 13, 2022, each of which is incorporated by reference herein in its entirety.

TECHNICAL FIELD

The various embodiments described in this document relate in general to the field of solar cell technologies, and more specifically to a method for preparing a solar cell, a solar cell, and a tandem solar cell.

BACKGROUND

Fossil energy has air pollution and limited reserves, but solar energy has the advantages of clean, pollution-free, abundant resources, and the like. Therefore, the solar energy is gradually becoming core clean energy instead of the fossil energy. Because solar cells have good photoelectric conversion efficiency, the solar cells have become a focus of development of clean energy utilization.

An important factor affecting a proportion of the solar energy in energy utilization is the photoelectric conversion efficiency of the solar cell. To improve the photoelectric conversion efficiency of the solar cell, it is a basic idea to optimize a structure design and material composition of the solar cell. A perovskite solar cell has a good development prospect due to a relatively long service life and relatively stable photoelectric conversion efficiency.

However, the current perovskite solar cell has problems of limited photoelectric conversion efficiency and relatively poor stability.

SUMMARY

An embodiment of the present disclosure provides a method for preparing a solar cell, including: providing a carrier plate and a separation auxiliary layer sequentially stacked in a first direction; forming a perovskite absorption layer over a surface of the separation auxiliary layer facing away from the carrier plate, where the perovskite absorption layer has a first side facing away from the separation auxiliary layer and a second side opposite to the first side, and includes a bonding matrix and a plurality of monocrystal perovskite particles arranged in the bonding matrix, at least some of the plurality of monocrystal perovskite particles have respective first convex surfaces protruding from the bonding matrix on the first side of the perovskite absorption layer and respective second convex surfaces protruding from the bonding matrix on the second side of the perovskite absorption layer, and a functional layer is formed on a surface of a respective monocrystal perovskite particle of a portion of the plurality of monocrystal perovskite particles; forming a first carrier transport layer on the first side of the perovskite absorption layer; forming a first conductive layer over a surface of the first carrier transport layer facing away from the first surface; and removing the carrier plate and the separation auxiliary layer to expose the second side of the perovskite absorption layer, and forming a second conductive layer on the second side of the perovskite absorption layer.

In some embodiments, the functional layer may be formed by: immersing the respective monocrystal perovskite particle in functional layer growth mother liquor, and forming a first functional layer covering the entire surface of the respective monocrystal perovskite particle.

In some embodiments, after forming the perovskite absorption layer, the method further includes: removing the first functional layer on one or both of the first convex surface and the second convex surface of the respective monocrystal perovskite particle.

In some embodiments, after removing the first functional layer on the first convex surface of the respective monocrystal perovskite particle, the method further includes: forming a second functional layer on the first side of the perovskite absorption layer and the first convex surface of the respective monocrystal perovskite particle; and forming the first carrier transport layer includes: forming the first carrier transport layer on a surface of the second functional layer facing away from the perovskite absorption layer.

In some embodiments, after removing the separation auxiliary layer and the carrier plate, the method further includes: removing the first functional layer on the second convex surface of the respective monocrystal perovskite particle.

In some embodiments, after removing the first functional layer on the second convex surface of the respective monocrystal perovskite particle, the method further includes: forming a third functional layer on the second side of the perovskite absorption layer and the second convex surface of the respective monocrystal perovskite particle; and forming the second conductive layer includes: forming the second conductive layer over a surface of the third functional layer facing away from the perovskite absorption layer.

In some embodiments, the functional layer may be formed by: after the perovskite absorption layer is formed, forming a fourth functional layer over a surface of the perovskite absorption layer facing away from the separation auxiliary layer and the first convex surfaces of the portion of the plurality of monocrystal perovskite particles; and forming the first carrier transport layer includes: forming the first carrier transport layer on a surface of the fourth functional layer facing away from the perovskite absorption layer.

In some embodiments, the functional layer may be formed by: after the carrier plate and the separation auxiliary layer are removed, forming a fifth functional layer over a surface of the perovskite absorption layer facing away from the first carrier transport layer and the second convex surfaces of the portion of the plurality of monocrystal perovskite particles; and forming the second conductive layer includes: forming the second conductive layer over a surface of the fifth functional layer facing away from the perovskite absorption layer.

In some embodiments, the method further includes: forming a second carrier transport layer on the second side of the perovskite absorption layer after the carrier plate and the separation auxiliary layer are removed; and forming the second conductive layer includes: forming the second conductive layer over a surface of the second carrier transport layer facing away from the perovskite absorption layer.

Correspondingly, an embodiment of the present disclosure further provides a solar cell, including: a second conductive layer, a perovskite absorption layer, a first carrier transport layer, and a first conductive layer sequentially stacked in a first direction.

The perovskite absorption layer has a first side facing the first carrier transport layer and a second side opposite to the first side and facing the second conductive layer, and includes a bonding matrix and a plurality of monocrystal perovskite particles arranged in the bonding matrix, at least some of the plurality of monocrystal perovskite particles have respective first convex surfaces protruding from the bonding matrix on the first side of the perovskite absorption layer and respective second convex surfaces protruding from the bonding matrix on the second side of the perovskite absorption layer, and a functional layer is formed on a surface of a respective monocrystal perovskite particle of a portion of the plurality of monocrystal perovskite particles.

In some embodiments, the functional layer includes a first functional layer covering the entire surface of the respective monocrystal perovskite particle.

In some embodiments, the functional layer includes a second functional layer covering a remaining surface of the respective monocrystal perovskite particle other than the first convex surface.

In some embodiments, the functional layer includes a third functional layer covering a remaining surface of the respective monocrystal perovskite particle other than the second convex surface.

In some embodiments, the functional layer includes a fourth functional layer covering a remaining surface of the respective monocrystal perovskite particle other than the first convex surface and the second convex surface.

In some embodiments, the functional layer includes a fifth functional layer covering the first convex surfaces of the portion of the plurality of monocrystal perovskite particles and a surface on the first side of the perovskite absorption layer.

In some embodiments, the functional layer includes a sixth functional layer covering the second convex surfaces of the portion of the plurality of monocrystal perovskite particles and a surface on the second side of the perovskite absorption layer.

In some embodiments, the functional layer has a thickness in a range of 0.1 nm to 1 μm.

In some embodiments, for any one of the plurality of monocrystal perovskite particles, a distance between a respective monocrystal perovskite particle and an adjacent monocrystal perovskite particle is not greater than a maximum distance between any two points on a surface of the respective monocrystal perovskite particle.

In some embodiments, a maximum distance between any two points on the surface of a respective monocrystal perovskite particle of the plurality of monocrystal perovskite particles is in a range of 5 μm to 100 μm.

In some embodiments, an area of an orthographic projection of the perovskite absorption layer on the first conductive layer is a first area, an area of an orthographic projection of the plurality of monocrystal perovskite particles on the first conductive layer is a second area, and a ratio of the second area to the first area is in a range of 0.3 to 0.9.

In some embodiments, a distance between any point on the first convex surface and a surface on the first side of the perovskite absorption layer in the first direction is not greater than half of a maximum length of a respective monocrystal perovskite particle of the plurality of monocrystal perovskite particles in the first direction; and/or a distance between any point on the second convex surface and a surface on the second side of the perovskite absorption layer in the first direction is not greater than half of the maximum length of a respective monocrystal perovskite particle of the plurality of monocrystal perovskite particles in the first direction.

In some embodiments, the bonding matrix has a thickness not less than 100 nm in the first direction.

In some embodiments, the bonding matrix includes a light trapping surface facing the first carrier transport layer and/or facing the second conductive layer.

In some embodiments, the light trapping surface includes a first light trapping structure, extending in the first direction to the outside of the bonding matrix.

In some embodiments, the light trapping surface includes a second light trapping structure, recessed in the first direction to the inside of the bonding matrix.

In some embodiments, the first carrier transport layer is an electron transport layer or a hole transport layer.

In some embodiments, the solar cell further includes: a second carrier transport layer, located between the perovskite absorption layer and the second conductive layer and in contact with the perovskite absorption layer and the second conductive layer respectively.

Correspondingly, an embodiment of the present disclosure further provides a tandem solar cell, including: a top cell, a bonding layer, and a bottom cell stacked in sequence, where the top cell is the foregoing solar cell.

BRIEF DESCRIPTION OF THE DRAWINGS

One or more embodiments are described by way of example with reference to the corresponding figures in the accompanying drawings, and the descriptions are not to be construed as limiting the embodiments. Unless otherwise particularly stated, the figures in the accompanying drawings are not drawn to scale.

DETAILED DESCRIPTION OF THE EMBODIMENTS

It can be learned from the background that the perovskite solar cell has good development prospect due to the advantages of the service life and the photoelectric conversion efficiency, but a current perovskite solar cell sheet has limited photoelectric conversion efficiency and relatively poor stability.

An embodiment of the present disclosure provides a method for preparing a solar cell. In a process of producing a solar cell, a perovskite absorption layer of a solar cell is formed by a bonding matrix and a plurality of monocrystal perovskite particles arranged in the bonding matrix. The perovskite absorption layer is constructed by using the monocrystal perovskite particles, so as to ensure stability of the perovskite absorption layer. The monocrystal perovskite particles are arranged in the bonding matrix, so as to avoid damage to monocrystal perovskite by a cutting process and ensure efficiency of the solar cell. In addition, the perovskite absorption layer is constructed in a monocrystal particle arrangement manner to facilitate preparation of a large-area monocrystal perovskite solar cell. In the plurality of monocrystal perovskite particles arranged in the bonding matrix, at least some of the monocrystal perovskite particles have first convex surfaces protruding relative to a first surface of the bonding matrix and second convex surfaces protruding relative to a second surface of the bonding matrix respectively. The perovskite absorption layer is constructed by using the monocrystal perovskite particles exposed on two opposite surfaces of the bonding matrix, so that the perovskite absorption layer has a texturing structure, and thus has a good light absorption capability. In addition, a capability of transmitting a photo-generated carrier from the perovskite absorption layer to a conductive layer or a carrier transport layer is improved, and photoelectric conversion efficiency and a photoelectric conversion capability of the solar cell are improved. A functional layer is formed over a surface of the monocrystal perovskite particle, to further reduce a decomposition probability of the monocrystal perovskite particle in a working process, thereby further improving stability of the solar cell.

The following describes in detail the embodiments of the present disclosure with reference to accompanying drawings. However, a person of ordinary skill in the art should understand that in the embodiments of the present disclosure, many technical details are provided for a thorough understanding of the present disclosure. However, the technical solutions as claimed in the present disclosure may be practiced without these technical details and various changes and modifications based on the following embodiments.

An embodiment of the present disclosure provides a method for a solar cell, applied to a cell production device. For a solar cell preparation process, reference may be made to FIG. 1.

Figure 1:
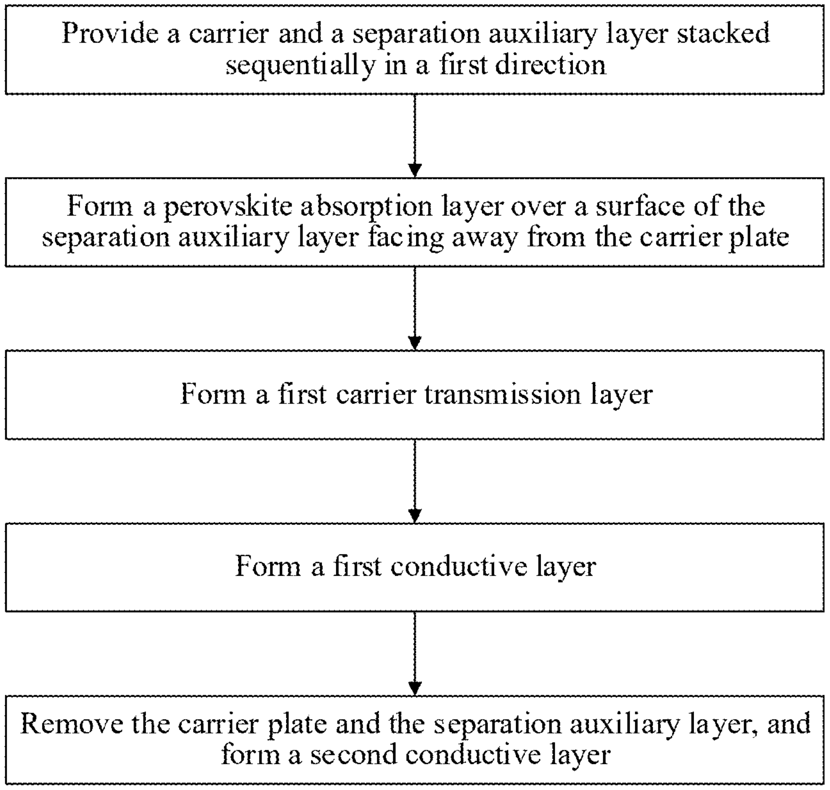
FIG. 1 is a flowchart illustrating a method for preparing a solar cell in accordance with some embodiments.
Figure 2:
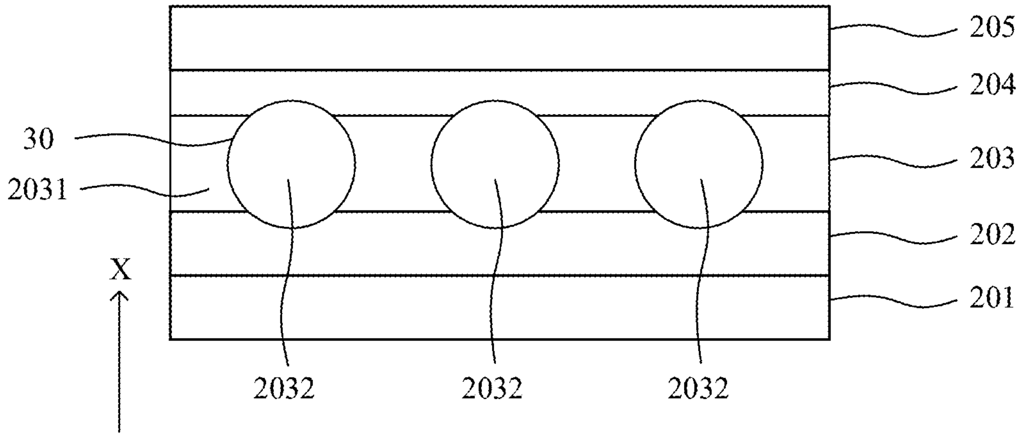
FIG. 2 is a schematic diagram illustrating a structure of a semi-finished solar cell in accordance with some embodiments.

Referring to FIG. 1 and FIG. 2, a carrier plate 201 and a separation auxiliary layer 202 sequentially stacked in a first direction are provided. FIG. 2 is a schematic diagram illustrating a structure of a solar cell after preparation of a first conductive layer 205 is completed. An X direction is a first direction.

In a solar cell preparation process, the carrier plate 201 and the separation auxiliary layer 202 stacked in the first direction may be first provided. The carrier plate 201 is used as a temporary substrate, so that subsequent preparation can be accurately performed on the temporary substrate. A function of the separation auxiliary layer 202 is to separate a finished or semi-finished solar cell from the carrier plate 201, to facilitate removal of the carrier plate 201. Therefore, a material of the carrier plate 201 may be polyamide, glass, stable metal, or the like that is not easily deformed and relatively stable. The separation auxiliary layer 202 not only needs to separate the carrier plate 201 from the cell, but also needs to be easy to remove. Therefore, titanium dioxide, metal, a photoresist, or the like that is easy to etch and remove may be selected as a material of the separation auxiliary layer 202. The carrier plate 201 and the separation auxiliary layer 202 sequentially stacked in the first direction are provided, so that the solar cell has a stable temporary carrier, and the temporary carrier is easy to remove, thereby ensuring efficiency and an effect of solar cell preparation.

It should be noted that an arrangement manner of the carrier plate 201 and the separation auxiliary layer 202 may be that the separation auxiliary layer 202 is first manufactured, then the carrier plate 201 is manufactured over a side surface of the separation auxiliary layer 202, and the manufactured separation auxiliary layer 202 and carrier plate 201 are placed according to a position relationship in which the carrier plate 201 and the separation auxiliary layer 202 are sequentially stacked in the first direction, or may be that the carrier plate 201 is first manufactured, then the separation auxiliary layer 202 is manufactured on a side surface of the carrier plate 201, and the manufactured separation auxiliary layer 202 and carrier plate 201 are placed according to a position relationship in which the carrier plate 201 and the separation auxiliary layer 202 are sequentially stacked in the first direction. This is not limited in this embodiment of the present disclosure.

A perovskite absorption layer 203 is formed over a surface of the separation auxiliary layer 202 facing away from the carrier plate 201.

After providing the carrier plate 201 and the separation auxiliary layer 202 sequentially stacked in the first direction, by using a cell production device, the perovskite absorption layer 203 is formed over the surface of the separation auxiliary layer 202 facing away from the carrier plate 201. The perovskite absorption layer 203 includes a bonding matrix 2031 and a plurality of monocrystal perovskite particles 2032 arranged in the bonding matrix 2031. In the first direction, the bonding matrix 2031 includes a first surface and a second surface opposite to the first surface, and the first surface is facing away from the separation auxiliary layer 202. At least some of the monocrystal perovskite particles 2032 have first convex surfaces and second convex surfaces, the first convex surfaces protrude relative to the first surface, and the second convex surfaces protrude relative to the second surface. A functional layer 30 is formed over a surface of the monocrystal perovskite particle 2032.

The perovskite absorption layer 203 of the solar cell is formed by the bonding matrix 2031 and the plurality of monocrystal perovskite particles 2032 arranged in the bonding matrix 2031, so as to ensure stability of the perovskite absorption layer 203. The monocrystal perovskite particles 2032 are arranged in the bonding matrix 2031, so as to avoid damage to monocrystal perovskite by a cutting process and ensure efficiency of the solar cell. In addition, the perovskite absorption layer 203 is constructed in a monocrystal particle arrangement manner, so as to facilitate formation of a large-area absorption layer and a monocrystal perovskite solar cell, and improve production efficiency.

In the plurality of monocrystal perovskite particles 2032 arranged in the bonding matrix 2031, at least some of the monocrystal perovskite particles 2032 have the first convex surfaces protruding relative to the first surface of the bonding matrix 2031 and the second convex surfaces protruding relative to the second surface of the bonding matrix 2031. The perovskite absorption layer 203 is constructed by using the monocrystal perovskite particles 2032 exposed on two opposite surfaces of the bonding matrix 2031, so that the perovskite absorption layer 203 has a texturing structure, and thus has a good light absorption capability. In addition, the monocrystal perovskite particles 2032 are exposed from the bonding matrix 2031, to enhance a capability of transmitting a photo-generated carrier from the perovskite absorption layer 203 to a conductive layer or a carrier transport layer, and improve photoelectric conversion efficiency and a photoelectric conversion capability of the solar cell.

The functional layer 30 is formed over the surface of the monocrystal perovskite particle 2032, to further reduce a decomposition probability of the monocrystal perovskite particle 2032 in a working process, thereby further improving stability of the solar cell.

It should be noted that the perovskite absorption layer 203 may be formed by first forming the bonding matrix 2031 on the surface of the separation auxiliary layer 202 facing away from the carrier plate 201 and then arranging the monocrystal perovskite particles 2032 in the bonding matrix 2031. The manner of first forming the bonding matrix 2031 facilitates arrangement and fixing of the monocrystal perovskite particles 2032. Alternatively, the perovskite absorption layer 203 may be formed by first arranging the plurality of monocrystal perovskite particles 2032 on the surface of the separation auxiliary layer 202 facing away from the carrier plate 201 and then forming the bonding matrix 2031. The first arrangement of the monocrystal perovskite particles 2032 facilitates accurate formation of the first convex surfaces and the second convex surfaces. In addition, the complete perovskite absorption layer 203 may alternatively be formed in advance, and then the perovskite absorption layer 203 is directly transferred to the surface of the separation auxiliary layer 202 facing away from the carrier plate 201. A specific forming manner of the perovskite absorption layer 203 is not limited in this embodiment of the present disclosure.

In addition, the functional layer 30 may be a passivation layer obtained through passivation processing or may be a modification layer formed through deposition or growth or the like. A specific type and a forming manner of the functional layer 30 are not limited in this embodiment of the present disclosure.

A first carrier transport layer 204 is formed.

By using the cell production device, after forming the perovskite absorption layer 203, the first carrier transport layer 204 is formed over a surface of the perovskite absorption layer 203. The first carrier transport layer 204 is located on the surface of the perovskite absorption layer 203 facing away from the separation auxiliary layer 202. The first carrier transport layer 204 is formed over the surface of the perovskite absorption layer 203 facing away from the separation auxiliary layer 202, so that the solar cell has good collection and transport capabilities for a specific type of photo-generated carrier, and recombination of different carriers can be reduced, thereby improving the photoelectric conversion efficiency of the finished solar cell.

A first conductive layer 205 is formed.

By using the cell production device, after forming the first carrier transport layer 204, the first conductive layer 205 is formed over a surface of the first carrier transport layer 204. The first conductive layer 205 is located on the surface of the first carrier transport layer 204 facing away from the first surface of the perovskite absorption layer 203. The first conductive layer 205 is formed over the surface of the first carrier transport layer 204 facing away from the first surface of the perovskite absorption layer 203, to facilitate power output.

Figure 3:
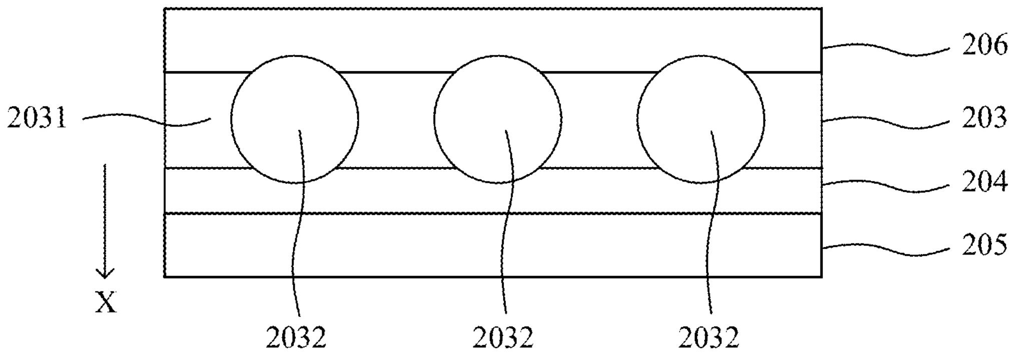
FIG. 3 is a schematic diagram illustrating a structure of a solar cell in accordance with some embodiments.

Referring to FIG. 2 and FIG. 3, the carrier plate 201 and the separation auxiliary layer 202 are removed, and a second conductive layer 206 is formed.

By using the cell production device, after forming the first conductive layer 205, the semi-finished cell is turned over, and then the carrier plate 201 and the separation auxiliary layer 202 are removed in sequence, or directly remove the separation auxiliary layer 202 and the carrier plate 201 simultaneously along a boundary between the separation auxiliary layer 202 and the perovskite absorption layer 203. After the carrier plate 201 and the separation auxiliary layer

202 are removed, the second conductive layer 206 is formed over a surface of the perovskite absorption layer 203. The second conductive layer 206 is located on the surface of the perovskite absorption layer 203 facing away from the first carrier transport layer 204. The second conductive layer 206 is formed over the surface of the perovskite absorption layer 203 facing away from the first carrier transport layer 204, so that when the first conductive layer 205 and the second conductive layer 206 are cooperated, power generated by the solar cell can be efficiently outputted.

Figure 4:
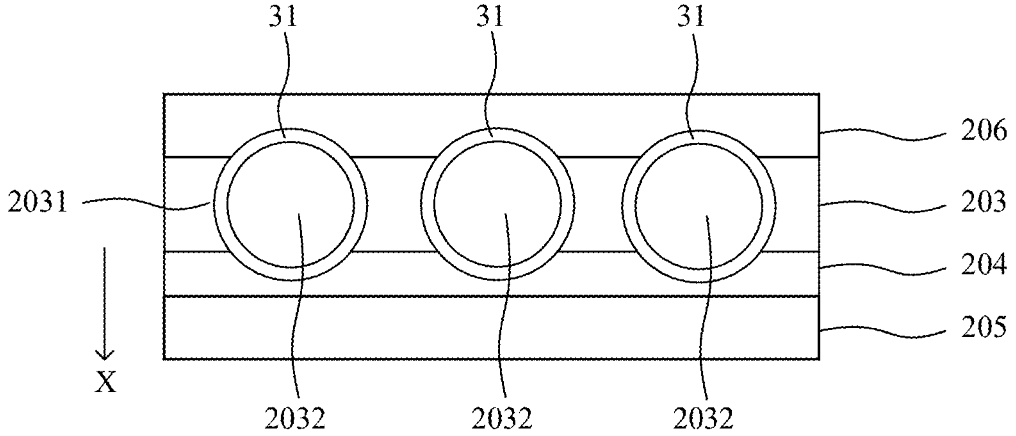
FIG. 4 is a schematic diagram illustrating a cross-sectional view of a solar cell in accordance with some embodiments.

Referring to FIG. 2 and FIG. 4, in some embodiments, the functional layer 30 may be formed in the following manner: immersing the monocrystal perovskite particle 2032 in functional layer growth mother liquor, and forming a first functional layer 31 covering the entire surface of the monocrystal perovskite particle 2032 on the surface of the monocrystal perovskite particle 2032.

FIG. 4 is a cross-sectional view of a solar cell. In the solar cell preparation process, by using the cell production device, before forming the perovskite absorption layer 203, the monocrystal perovskite particles 2032 are first immersed in the functional layer growth mother liquor, and takes out the monocrystal perovskite particles 2032 after a preset duration or after the first functional layers 31 covering the entire surface of the monocrystal perovskite particles 2032 are formed on the surface of the monocrystal perovskite particles 2032 respectively. Then the perovskite absorption layer 203 is formed by using the monocrystal perovskite particle 2032 of which the entire surface is covered by the first functional layer 31, and the first functional layer 31 is used as the functional layer 30 on the surface of a respective monocrystal perovskite particle 2032 in the perovskite absorption layer 203.

The monocrystal perovskite particle 2032 is immersed in the functional layer growth mother liquor, and the first functional layer 31 covering the entire surface is formed on the surface of the monocrystal perovskite particle 2032, to ensure that any of the monocrystal perovskite particles 2032 has relatively good stability in the working process, thereby ensuring the stability of the solar cell.

The functional layer growth mother liquor may be formed by dissolving phenylethylamine X (PEAX, X=I, Br, or Cl) or isobutylamine X (BAX, X=I, Br, or Cl) in indolepopionic acid ($C_{11}H_{11}NO_2$, IPA). A configuration manner of the growth mother liquor is not limited in this embodiment of the present disclosure.

It should be noted that the functional layer growth mother liquor may not only be liquid mother liquor formed by dissolving a specific salt in indolepopionic acid, but also gaseous mother liquor composed of gasified acetonitrile ($C_2H_3N$), indolepopionic acid, or water. The monocrystal perovskite particle 2032 is placed in gasified acetonitrile ($C_2H_3N$), indolepopionic acid, or water, the functional layer 30 may be also formed on the surface of the monocrystal perovskite particle 2032. A specific type and a configuration manner of the functional layer growth mother liquor are not limited in this embodiment of the present disclosure.

Figure 5:
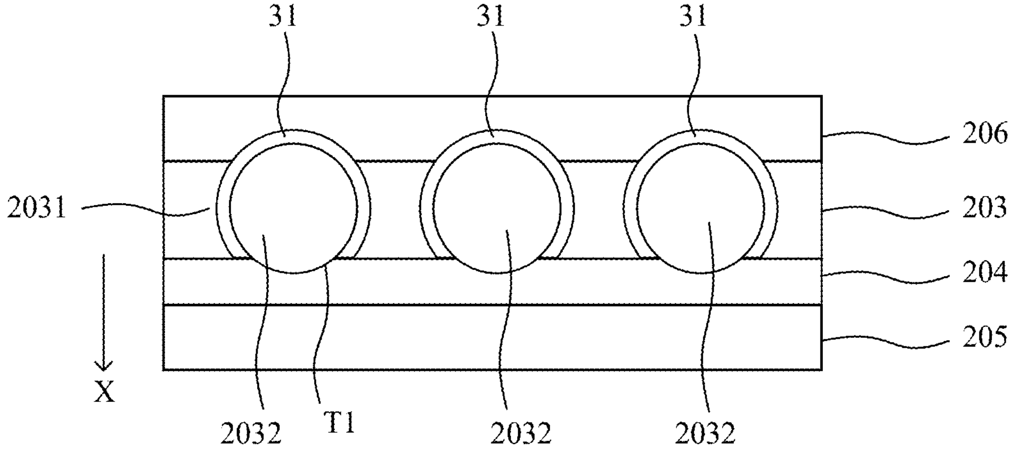
FIG. 5 is a schematic diagram illustrating a cross-sectional view of another solar cell in accordance with some embodiments

Referring to FIG. 2 and FIG. 5, in some embodiments, after the perovskite absorption layer 203 is formed, the method further includes: removing the first functional layer 31 on the first convex surface.

In the solar cell preparation process, by using the cell production device, after forming the perovskite absorption layer 203, the first functional layer 31 on the first convex surface T1 of the monocrystal perovskite particle 2032 is removed through physical etching or chemical etching or the like. The first convex surface T1 protrudes relative to the first surface of the bonding matrix 2031 away from the separation auxiliary layer 202. The remaining first functional layer 31 after the first functional layer 31 on the first convex surface T1 is removed is used as the functional layer 30 on the surface of a respective monocrystal perovskite particle 2032.

After the perovskite absorption layer 203 is formed, the first functional layer 31 on the first convex surface T1 is removed, and the remaining first functional layer 31 is used as the functional layer 30 on the surface of a respective monocrystal perovskite particle 2032, so that the stability of the monocrystal perovskite particle 2032 in the working process is ensured as much as possible, and light reflectivity of the first convex surface T1 is reduced, thereby ensuring that the monocrystal perovskite particle 2032 has a good light absorption capability, and further ensuring a carrier generation capability of the monocrystal perovskite particle 2032 and the photoelectric conversion capability of the solar cell.

It should be noted that in a process of removing the first functional layer 31 on the first convex surface T1, the first functional layer 31 on the first convex surface T1 may be completely removed, or the first functional layer 31 on the first convex surface T1 may not be completely removed. A degree of removal may be adjusted according to a requirement for the stability and/or the light absorption capability of the monocrystal perovskite particle 2032. This is not limited in this embodiment of the present disclosure.

Figure 6:
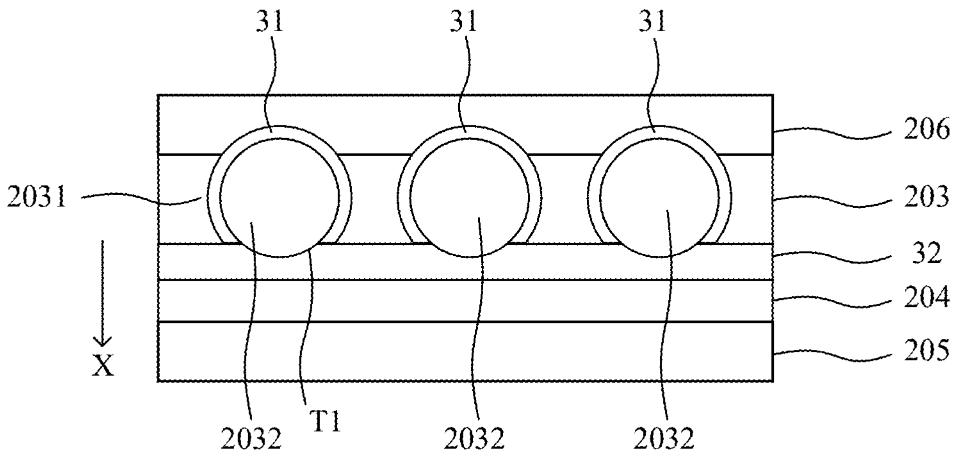
FIG. 6 is a schematic diagram illustrating a cross-sectional view of still another solar cell in accordance with some embodiments.

Referring to FIG. 2 and FIG. 6, in some embodiments, after the first functional layer 31 on the first convex surface T1 is removed, the method further includes: forming a second functional layer 32, where the second functional layer 32 covers the first surface of the bonding matrix 2031 and the first convex surface T1. The first carrier transport layer 204 is formed by forming the first carrier transport layer 204 on a surface of the second functional layer 32 away from the first surface of the bonding matrix 2031.

By using the cell production device, after removing the first functional layer 31 on the first convex surface T1, the second functional layer 32 is formed over the first surface of the bonding matrix 2031 away from the separation auxiliary layer 202. The second functional layer 32 covers the first convex surface T1 of the monocrystal perovskite particle 2032 and the first surface of the bonding matrix 2031, and the second functional layer 32 located on the first convex surface T1 and the remaining first functional layer 31 after the first functional layer 31 on the first convex surface T1 is removed are used as the functional layer 30 on the surface of the monocrystal perovskite particle 2032.

The second functional layer 32 located on the first convex surface T1 and the first surface of the bonding matrix 2031 is prepared, to increase a coverage area of the functional layer 30 on the surface of the monocrystal perovskite particle 2032 and improve the stability of the perovskite absorption layer 203. In addition, the second functional layer 32 covers the first surface of the bonding matrix 2031, so that reflectivity of light inside the bonding matrix 2031 is increased, and the light absorption capability of the perovskite absorption layer 203 is enhanced, thereby improving the photoelectric conversion capability of the solar cell.

It should be noted that the second functional layer 32 may be integrally formed on the surface of the perovskite absorption layer 203 directly and covers the first convex surface T1 of a respective monocrystal perovskite particle 2032, or may be selectively formed on the surface of the perovskite absorption layer 203 according to a preset pattern and does not cover all regions on the first convex surfaces T1 of all the monocrystal perovskite particles 2032 and the first surface of the bonding matrix 2031. The second functional layer 32 may cover the entire first convex surface T1 or may cover only a part of the first convex surface T1. This is not limited in this embodiment of the present disclosure.

Figure 7:
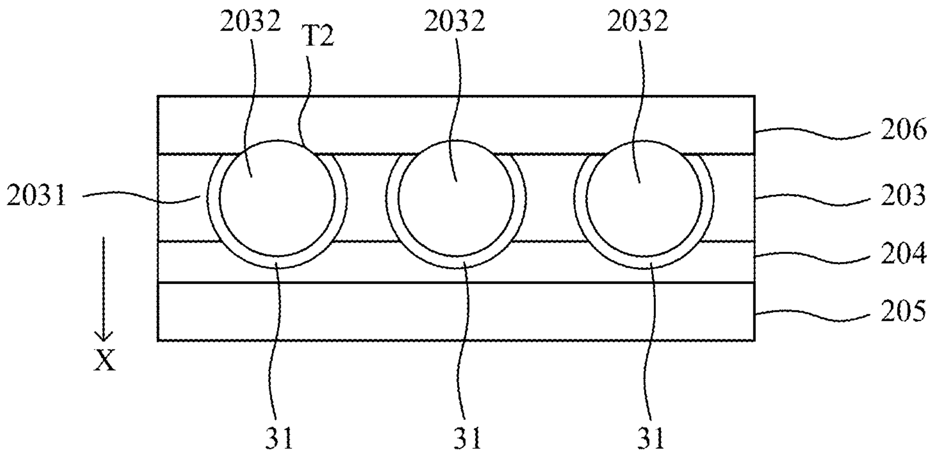
FIG. 7 is a schematic diagram illustrating a cross-sectional view of yet another solar cell in accordance with some embodiments.

Referring to FIG. 2 and FIG. 7, in some embodiments, after removing the separation auxiliary layer 202 and the carrier plate 201, the method further includes: removing the first functional layer 31 on the second convex surface T2.

By using the cell production device, after removing the separation auxiliary layer 202 and the carrier plate 201, the first functional layer 31 on the second convex surface T2 of the monocrystal perovskite particle 2032 is removed through physical etching or chemical etching or the like. The second convex surface T2 protrudes relative to the second surface of the bonding matrix 2031 away from the first carrier transport layer 204. The remaining first functional layer 31 after the first functional layer 31 on the second convex surface T2 is removed is used as the functional layer 30 on the surface of a respective monocrystal perovskite particle 2032.

After the perovskite absorption layer 203 is formed, the first functional layer 31 on the second convex surface T2 is removed, and the remaining first functional layer 31 is used as the functional layer 30 on the surface of a respective monocrystal perovskite particle 2032, so that the stability of the monocrystal perovskite particle 2032 in the working process is ensured as much as possible, and light reflectivity of the second convex surface T2 is reduced, thereby ensuring that the monocrystal perovskite particle 2032 has a good light absorption capability, and further ensuring a carrier generation capability of the monocrystal perovskite particle 2032 and the photoelectric conversion capability of the solar cell.

It should be noted that in a process of removing the first functional layer 31 on the second convex surface T2, the first functional layer 31 on the second convex surface T2 may be completely removed, or the first functional layer 31 on the second convex surface T2 may not be completely removed. A degree of removal may be adjusted according to a requirement for the stability and/or the light absorption capability of the monocrystal perovskite particle 2032. This is not limited in this embodiment of the present disclosure.

Figure 8:
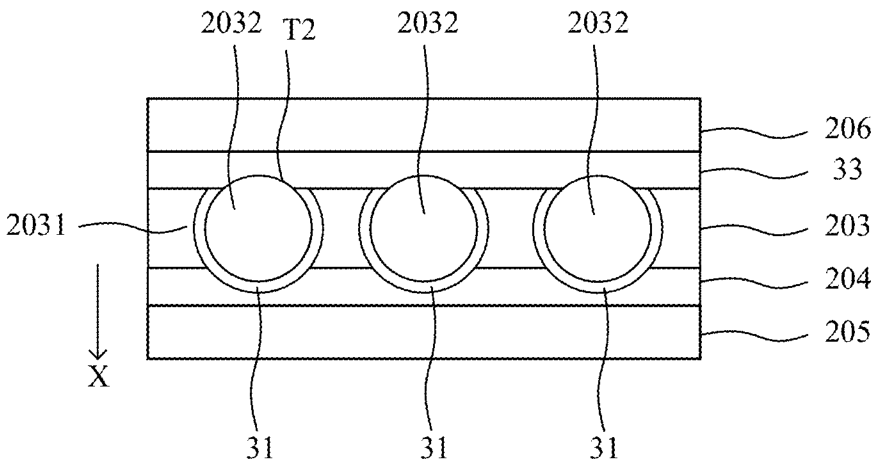
FIG. 8 is a schematic diagram illustrating a cross-sectional view of still another solar cell in accordance with some embodiments.

Referring to FIG. 2 and FIG. 8, in some embodiments, after the first functional layer 31 on the second convex surface T2 is removed, the method further includes: forming a third functional layer 33, where the third functional layer 33 covers the second surface of the bonding matrix 2031 and the second convex surface T2. The second conductive layer 206 is formed by forming the second conductive layer 206 on a surface of the third functional layer 33 away from the second surface of the bonding matrix 2031.

By using the cell production device, after removing the first functional layer 31 on the second convex surface T2, the third functional layer 33 is formed on the second surface of the bonding matrix 2031. The third functional layer 33 covers the second convex surface T2 of the monocrystal perovskite particle 2032 and the second surface of the bonding matrix 2031, and the third functional layer 33 located on the second convex surface T2 and the remaining first functional layer 31 after the first functional layer 31 on the second convex surface T2 is removed are used as the functional layer 30 on the surface of the monocrystal perovskite particle 2032.

The third functional layer 33 located on the second convex surface T2 and the second surface of the bonding matrix 2031 is prepared, to increase a coverage area of the functional layer 30 on the surface of the monocrystal perovskite particle 2032 and improve the stability of the perovskite absorption layer 203. In addition, the third functional layer 33 covers the second surface of the bonding matrix 2031, so that reflectivity of light inside the bonding matrix 2031 is increased, and the light absorption capability of the perovskite absorption layer 203 is enhanced, thereby improving the photoelectric conversion capability of the solar cell.

It should be noted that the third functional layer 33 may be integrally formed on the surface of the perovskite absorption layer 203 directly and covers the second convex surface T2 of a respective monocrystal perovskite particle 2032, or may be selectively formed on the surface of the perovskite absorption layer 203 according to a specific pattern and does not cover all regions on the second convex surfaces T2 of all the monocrystal perovskite particles 2032 and the second surface of the bonding matrix 2031. The third functional layer 33 may cover the entire second convex surface T2 or may cover only a part of the second convex surface T2. This is not limited in this embodiment of the present disclosure.

In addition, in the solar cell preparation process, the third functional layer 33 or the second functional layer 32 may be formed on only the surface of the perovskite absorption layer 203, or the third functional layer 33 and the second functional layer 32 may be cooperatively implemented. This is not limited in this embodiment of the present disclosure.

Figure 9:
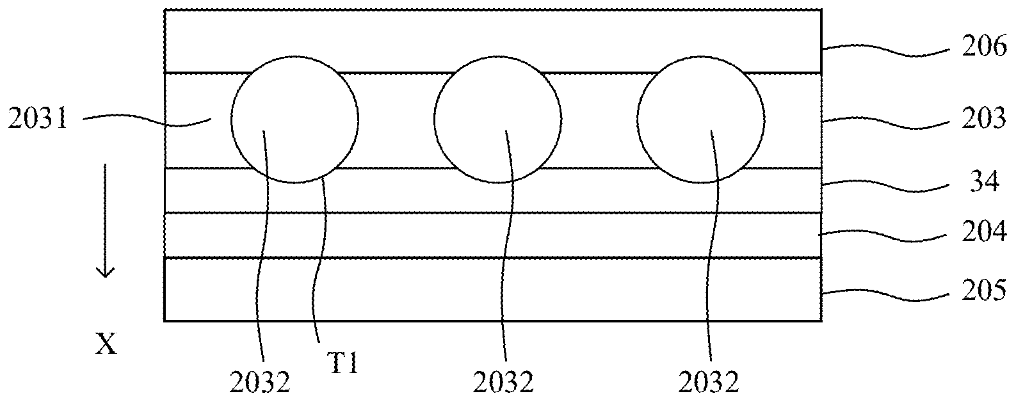
FIG. 9 is a schematic diagram illustrating a cross-sectional view of still another solar cell in accordance with some embodiments.

Referring to FIG. 2 and FIG. 9, in some embodiments, In addition, the functional layer 30 may be formed in the following manner: after the perovskite absorption layer 203 is formed, forming a fourth functional layer 34 on the surface of the perovskite absorption layer 203 away from the separation auxiliary layer 202, where the fourth functional layer 34 covers the first surface and the first convex surface T1. The first carrier transport layer 204 is formed by forming the first carrier transport layer 204 on a surface of the fourth functional layer 34 away from the first surface.

In the solar cell preparation process, after forming the perovskite absorption layer 203, by using the cell production device, the fourth functional layer 34 is directly formed on the surface of the perovskite absorption layer 203 away from the separation auxiliary layer 202 regardless of whether passivation processing or modification processing is performed on the surface of the monocrystal perovskite particle 2032. The fourth functional layer 34 covers the first surface of the bonding matrix 2031 and the first convex surface T1 of the monocrystal perovskite particle 2032, and the fourth functional layer 34 on the first convex surface T1 of the monocrystal perovskite particle 2032 is used as the functional layer 30 on the surface of the monocrystal perovskite particle 2032. Then, the first carrier transport layer 204 is formed on the surface of the fourth functional layer 34 away from the first surface of the bonding matrix 2031.

The fourth functional layer 34 covering the first surface of the bonding matrix 2031 and the first convex surface T1 of the monocrystal perovskite particle 2032 is prepared, so that the surface of the first convex surface T1 of the monocrystal perovskite particle 2032 has the functional layer 30, to improve the stability of the monocrystal perovskite particle 2032 in the working process. In addition, the fourth functional layer 34 covers the first surface of the bonding matrix 2031, so that reflectivity of light inside the bonding matrix 2031 is increased, and the light absorption capability of the perovskite absorption layer 203 is enhanced, thereby improving the photoelectric conversion capability of the solar cell.

It should be noted that the fourth functional layer 34 may be integrally formed on the surface of the perovskite absorption layer 203 directly and covers the first convex surface T1 of a respective monocrystal perovskite particle 2032, or may be selectively formed on the surface of the perovskite absorption layer 203 according to a specific pattern and does not cover all regions on the first convex surfaces T1 of all the monocrystal perovskite particles 2032 and the first surface of the bonding matrix 2031. The fourth functional layer 34 may cover the entire first convex surface T1 or may cover only a part of the first convex surface T1. This is not limited in this embodiment of the present disclosure.

Figure 10:
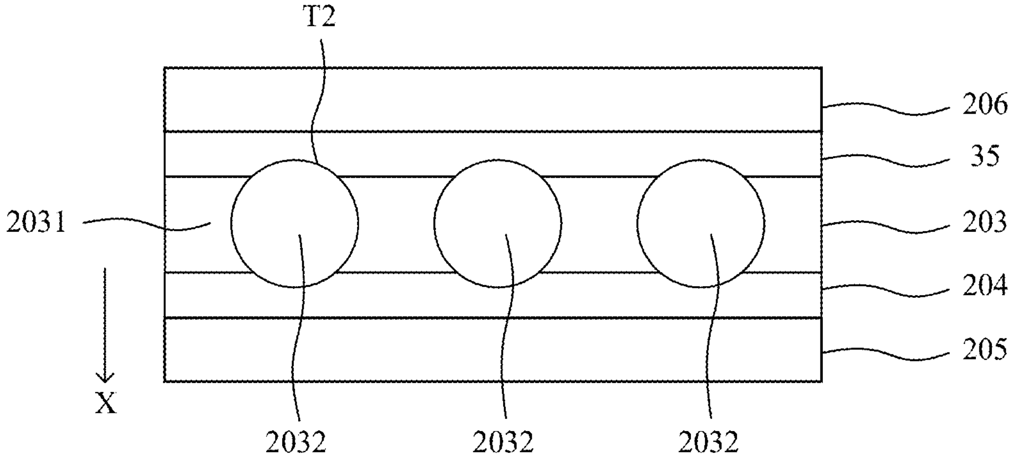
FIG. 10 is a schematic diagram illustrating a cross-sectional view of still another solar cell in accordance with some embodiments.

Referring to FIG. 2 and FIG. 10, in some embodiments, the functional layer 30 may be formed in the following manner: after the carrier plate 201 and the separation auxiliary layer 202 are removed, forming a fifth functional layer 35 on the surface of the perovskite absorption layer 203 away from the first carrier transport layer 204, where the fifth functional layer 35 covers the second surface and the second convex surface T2. The second conductive layer 206 is formed by forming the second conductive layer 206 on a surface of the fifth functional layer 35 away from the second surface.

In the solar cell preparation process, after removing the carrier plate 201 and the separation auxiliary layer 202, by using the cell production device, the fifth functional layer 35 is directly formed on the surface of the perovskite absorption layer 203 away from the first carrier transport layer 204 regardless of whether passivation processing or modification processing is performed on the surface of the monocrystal perovskite particle 2032. The fifth functional layer 35 covers the second surface of the bonding matrix 2031 and the second convex surface T2 of the monocrystal perovskite particle 2032, and the fifth functional layer 35 on the second convex surface T2 of the monocrystal perovskite particle 2032 is used as the functional layer 30 on the surface of the monocrystal perovskite particle 2032. Then, the second conductive layer 206 is formed on the surface of the fifth functional layer 35 away from the second surface of the bonding matrix 2031.

The fifth functional layer 35 covering the second surface of the bonding matrix 2031 and the second convex surface T2 of the monocrystal perovskite particle 2032 is prepared, so that the surface of the second convex surface T2 of the monocrystal perovskite particle 2032 has the functional layer 30, to improve the stability of the monocrystal perovskite particle 2032 in the working process. In addition, the fifth functional layer 35 covers the second surface of the bonding matrix 2031, so that reflectivity of light inside the bonding matrix 2031 is increased, and the light absorption capability of the perovskite absorption layer 203 is enhanced, thereby improving the photoelectric conversion capability of the solar cell.

It should be noted that the fifth functional layer 35 may be integrally formed on the surface of the perovskite absorption layer 203 directly and covers the second convex surface T2 of a respective monocrystal perovskite particle 2032, or may be selectively formed on the surface of the perovskite absorption layer 203 according to a specific pattern and does not cover all regions on the second convex surfaces T2 of all the monocrystal perovskite particles 2032 and the second surface of the bonding matrix 2031. The fifth functional layer 35 may cover the entire second convex surface T2 or may cover only a part of the second convex surface T2. This is not limited in this embodiment of the present disclosure.

In addition, in the solar cell preparation process, either of the fifth functional layer 35 and the fourth functional layer 34 may be formed on the surface of the perovskite absorption layer 203, or the fifth functional layer 35 and the fourth functional layer 34 may be cooperatively implemented. This is not limited in this embodiment of the present disclosure.

Figure 11:
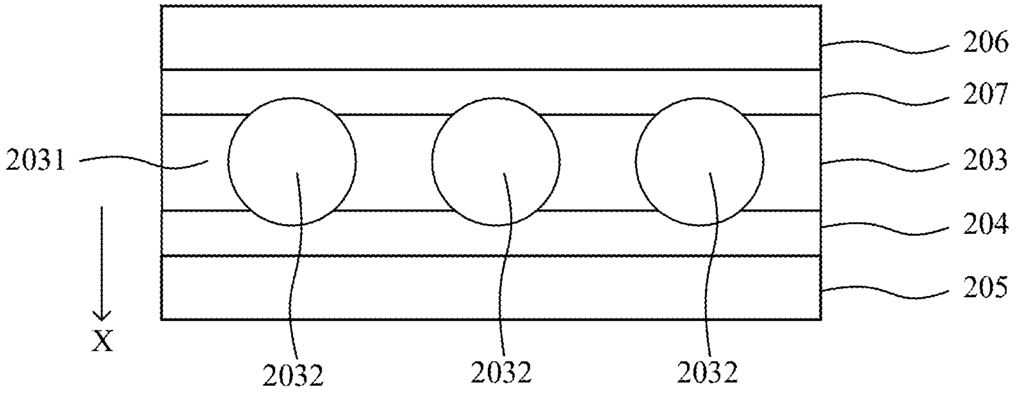
FIG. 11 is a schematic diagram illustrating another solar cell in accordance with some embodiments.

Referring to FIG. 2 and FIG. 11, in some embodiments, the method for preparing the solar cell further includes: forming a second carrier transport layer 207 after the carrier plate 201 and the separation auxiliary layer 202 are removed, where the second carrier transport layer 207 is located on the surface of the perovskite absorption layer 203 away from the first carrier transport layer 204. The second conductive layer 206 is formed by forming the second conductive layer 206 over a surface of the second carrier transport layer 207 away from the second surface.

In the solar cell preparation process, by using the cell production device, the second carrier transport layer 207 is formed over the surface of the perovskite absorption layer 203. The second carrier transport layer 207 is located on the surface of the perovskite absorption layer 203 away from the first carrier transport layer 204. Then, the second conductive layer 206 is formed on a surface of the second carrier transport layer 207 away from the second surface of the bonding matrix 2031. The second carrier transport layer 207 is formed on the surface of the perovskite absorption layer 203 away from the first carrier transport layer 204, so that the solar cell has good collection and transport capabilities for different types of photo-generated carrier when the two carrier transport layers cooperate with each other, and recombination of different carriers can be reduced, thereby improving the photoelectric conversion efficiency of the finished solar cell.

Based on the foregoing, in the method for preparing the solar cell provided in the embodiment of the present disclosure, the perovskite absorption layer 203 of the solar cell is formed by the bonding matrix 2031 and the plurality of monocrystal perovskite particles 2032 arranged in the bonding matrix 2031. The perovskite absorption layer 203 is constructed by using the monocrystal perovskite particles 2032, so as to ensure stability of the perovskite absorption layer 203. The monocrystal perovskite particles 2032 are arranged in the bonding matrix 2031, so as to avoid damage to monocrystal perovskite by a cutting process and ensure efficiency of the solar cell. In addition, the perovskite absorption layer 203 is constructed in a monocrystal particle arrangement manner to facilitate preparation of a large-area monocrystal perovskite solar cell. In the plurality of monocrystal perovskite particles 2032 arranged in the bonding matrix 2031, at least some of the monocrystal perovskite particles 2032 have the first convex surfaces protruding relative to the first surface of the bonding matrix 2031 and the second convex surfaces protruding relative to the second surface of the bonding matrix 2031. The perovskite absorption layer 203 is constructed by using the monocrystal perovskite particles 2032 exposed on two opposite surfaces of the bonding matrix 2031, so that the perovskite absorption layer 203 has a texturing structure, and thus has a good light absorption capability. In addition, a capability of transmitting a photo-generated carrier from the perovskite absorption layer 203 to a conductive layer or a carrier transport layer is improved, and photoelectric conversion efficiency and a photoelectric conversion capability of the solar cell are improved. The functional layer 30 is formed on the surface of the monocrystal perovskite particle 2032, so as to further reduce a decomposition probability of the monocrystal perovskite particle 2032 in a working process, thereby further improving stability of the solar cell.

Figure 12:
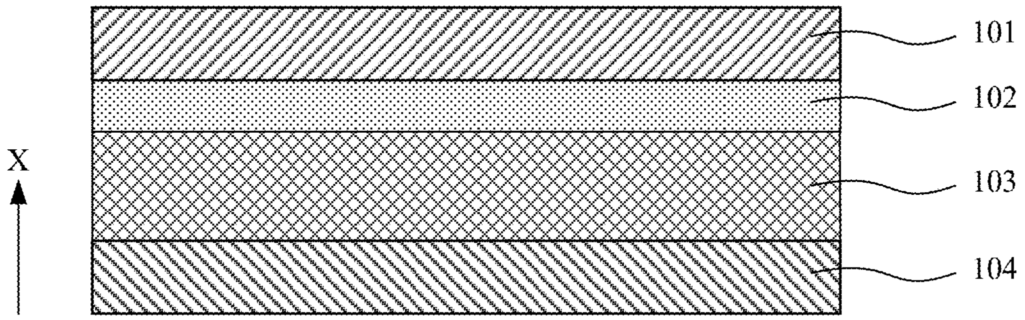
FIG. 12 is a schematic diagram illustrating a solar cell in accordance with some embodiments.
Figure 13:
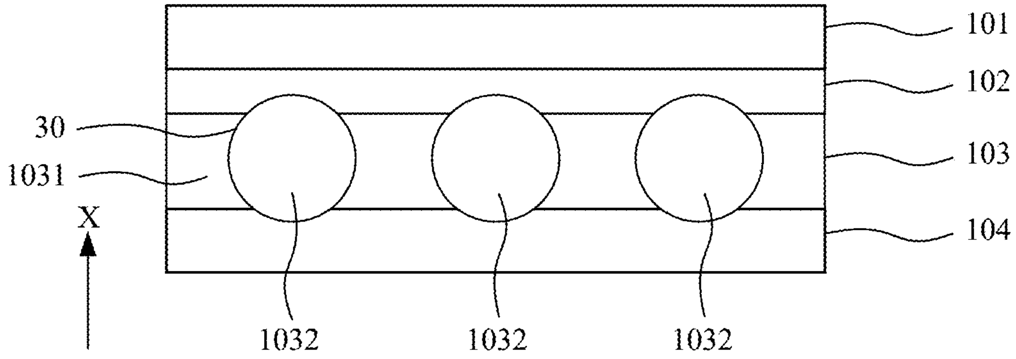
FIG. 13 is a schematic diagram illustrating a cross-sectional view of a solar cell in accordance with some embodiments.
Figure 14:
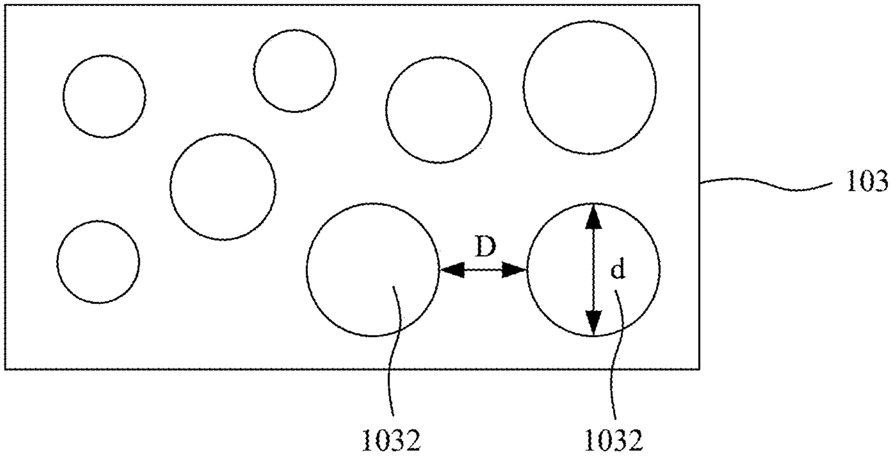
FIG. 14 is a schematic diagram illustrating a top view of a perovskite absorption layer in accordance with some embodiments.

Correspondingly, another aspect of an embodiment of the present disclosure further provides a solar cell. Referring to FIG. 12 to FIG. 14, FIG. 12 is a schematic diagram of an entire structure of a solar cell, FIG. 13 is a schematic diagram illustrating a cross-sectional structural of a solar cell, and FIG. 14 is a top view of a perovskite absorption layer 103. An X direction is a first direction.

The solar cell includes: a second conductive layer 104, a perovskite absorption layer 103, a first carrier transport layer 102, and a first conductive layer 101, and sequentially stacked in a first direction. The perovskite absorption layer 103 includes a bonding matrix 1031 and a plurality of monocrystal perovskite particles 1032 arranged in the bonding matrix 1031. In the first direction, the bonding matrix 1031 includes a first surface and a second surface that are opposite to each other, and the first surface faces the first conductive layer 101. At least some of the monocrystal perovskite particles 1032 have first convex surfaces and second convex surfaces, the first convex surfaces protrude relative to the first surface, and the second convex surfaces protrude relative to the second surface. A functional layer 30 is formed on a surface of the monocrystal perovskite particles 1032.

The bonding matrix 1031 is configured to accommodate and fix the monocrystal perovskite particles 1032 arranged in the bonding matrix 1031. Therefore, transparent curable glue or colloid may be selected for construction, for example, ultraviolet curing glue or another type of curable transparent glue such as acrylic glue or resin glue is selected for constructing the bonding matrix 1031. Transparent means good light transmittance for visible light, for example, 80% or more transmittance for light of 400 nm or more, or 75% or more transmittance for light of 450 nm or more.

In the solar cell, light irradiated to the solar cell is absorbed through the perovskite absorption layer 103, then a photo-generated carrier is generated through the monocrystal perovskite particle 1032, different photo-generated carriers are collected through the first carrier transport layer 102 and the second conductive layer 104 respectively, and finally electric energy generated by the solar cell is transmitted to an external component through the first conductive layer 101 and the second conductive layer 104.

In a working process of the solar cell, photoelectric conversion efficiency of a cell is mainly affected by a photo-generated carrier generation capability and photo-generated carrier collection and utilization capabilities. In a process of constructing the perovskite absorption layer 103, the perovskite absorption layer 103 is constructed by using the bonding matrix 1031 and the plurality of monocrystal perovskite particles 1032 arranged in the bonding matrix 1031, so as to ensure integrity of the monocrystal perovskite particle 1032, avoid damage to a monocrystal perovskite material in the construction process of the perovskite absorption layer 103, and ensure that the photo-generated carrier generation capability of the perovskite absorption layer 103 is as good as possible.

In addition, the perovskite absorption layer 103 is constructed by using the monocrystal perovskite particles 1032, so as to reduce a decomposition speed of the perovskite absorption layer 103 in the working process of the cell and ensure stability of the perovskite absorption layer 103 and the solar cell. In addition, the monocrystal perovskite particle 1032 has a longer carrier life, a higher carrier mobility, and a larger degree of diffusion. Therefore, the solar cell has higher photoelectric conversion efficiency and a longer service life.

In addition, the perovskite absorption layer 103 is constructed by arranging the monocrystal perovskite particles 1032 in the bonding matrix 1031, so as to facilitate simple and efficient preparation of the large-area perovskite absorption layer 103, and break through the restriction of raw material generation efficiency of monocrystal perovskite on areas of the perovskite absorption layer 103 and the perovskite solar cell, so that preparation efficiency of the large-area solar cell with good stability is greatly improved, and an application prospect of the monocrystal perovskite solar cell is improved.

The functional layer 30 is formed on the surface of the monocrystal perovskite particle 1032, and a function of the functional layer 30 is to compensate for the defect of the monocrystal perovskite particle 1032 and/or suppress decomposition of the monocrystal perovskite particle 1032. Therefore, the functional layer 30 is set to further reduce a decomposition probability of the monocrystal perovskite particle 1032 in the working process, thereby improving stability of the perovskite absorption layer 103 and the solar cell.

Referring to FIG. 13, in the first direction, the bonding matrix 1031 includes the first surface and the second surface that are opposite to each other. At least some of the monocrystal perovskite particles 1032 have the first convex surfaces and the second convex surfaces, the first convex surfaces protrude relative to the first surface, and the second convex surfaces protrude relative to the second surface. In the process of constructing the perovskite absorption layer 103, it is ensured that at least some of the monocrystal perovskite particles 1032 have the first convex surfaces and the second convex surfaces that protrude relative to the two opposite surfaces of the bonding matrix 1031 respectively, that is, the at least some of the monocrystal perovskite particles 1032 pass through the bonding matrix 1031 and are in contact with the first carrier transport layer 102 and the second conductive layer 104. Because the at least some of the monocrystal perovskite particles 1032 have the first convex surfaces and the second convex surfaces, two opposite surfaces of the perovskite absorption layer 103 are texturing surfaces, thereby improving a light absorption capability of the perovskite absorption layer 103. In addition, because the at least some of the monocrystal perovskite particles 1032 pass through the bonding matrix 1031 and are in contact with the first carrier transport layer 102 and the second conductive layer 104, after photo-generated carriers are generated, the difficulty in moving the photo-generated carriers to the first carrier transport layer 102 and the second conductive layer 104 is greatly reduced, and a photo-generated carrier transport capability of the perovskite absorption layer 103 is improved. Further, photoelectric conversion efficiency of the perovskite absorption layer 103 is improved in terms of the light absorption capability and the carrier transport capability.

It should be noted that the monocrystal perovskite particle 1032 may be in a shape of a regular polyhedron including a sphere, a near sphere, and a cube, an irregular polyhedron or the like. Sizes and shapes of the monocrystal perovskite particles 1032 included in the perovskite absorption layer 103 may be consistent or may be inconsistent. This is not limited in this embodiment of the present disclosure. In this embodiment of the present disclosure, for ease of understanding and description, an example in which the perovskite particle is in the shape of sphere is used for description, and the shape of the monocrystal perovskite particle 1032 may be adjusted as required in an actual use process. This is not limited in this embodiment of the present disclosure.

In addition, a respective monocrystal perovskite particle 1032 included in the perovskite absorption layer 103 may have the first convex surface and the second convex surface.

Alternatively, at least some particles may have the first convex surface and the second convex surface, and the remaining particles may include one or more particles that have only the first convex surface, or have only the second convex surface, or have neither the first convex surface nor the second convex surface. This is not limited in this embodiment of the present disclosure. The functional layer 30 may be formed on the surface of a respective monocrystal perovskite particle 1032, or the functional layers 30 may be formed on the surfaces of some of the monocrystal perovskite particles 1032. This is not limited in this embodiment of the present disclosure.

In addition, the monocrystal perovskite particles 1032 in the perovskite absorption layer 103 may be arranged into an ordered array in the bonding matrix 1031 according to a fixed interval, for example, arranged into a regular array in a shape of a rectangle, a near rectangle, a circle, an oval, or the like, to further improve uniformity of light absorption and carrier output by the perovskite absorption layer 103. Alternatively, the monocrystal perovskite particles 1032 may be freely arranged in the bonding matrix 1031 according to an unfixed interval and order.

Figure 15:
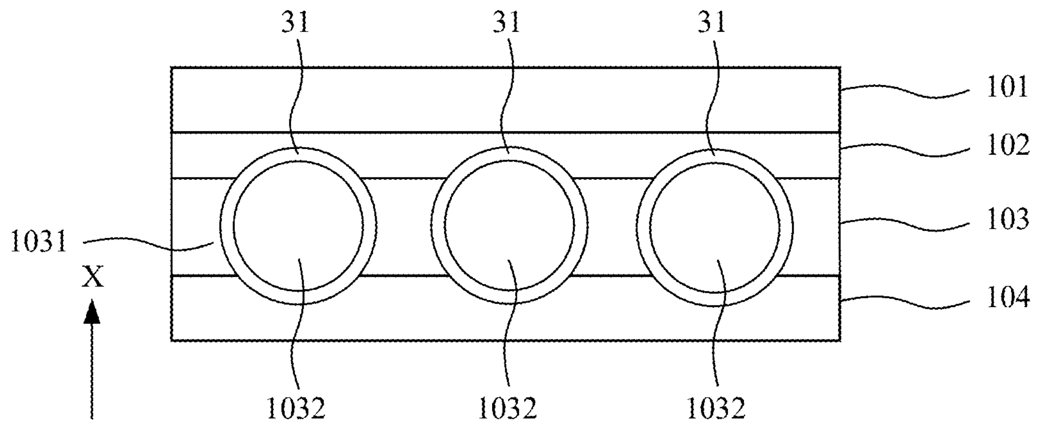
FIG. 15 is a schematic diagram illustrating a cross-sectional view of another solar cell in accordance with some embodiments.

Referring to FIG. 13 and FIG. 15, in some embodiments, the functional layer 30 includes a first functional layer 31 covering the entire surface of the monocrystal perovskite particle 1032.

In a solar cell preparation process, before the perovskite absorption layer 103 is formed, the first functional layer 31 covering the entire surface of the monocrystal perovskite particle 1032 is formed on the surface of the monocrystal perovskite particle 1032. Then the perovskite absorption layer 103 is formed by using the monocrystal perovskite particle 1032 of which the entire surface is covered by the first functional layer 31, and the first functional layer 31 is used as the functional layer 30 on the surface of a respective monocrystal perovskite particle 1032 in the perovskite absorption layer 103.

The first functional layer 31 covering the entire surface is formed on the surface of the monocrystal perovskite particle 1032, to ensure that any of the monocrystal perovskite particles 1032 has relatively good stability in the working process, thereby ensuring the stability of the solar cell.

Figure 16:
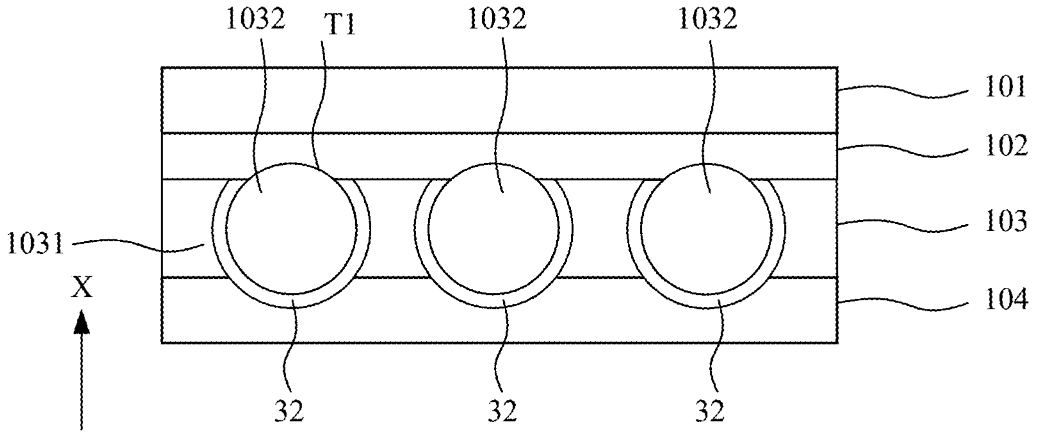
FIG. 16 is a schematic diagram illustrating a cross-sectional view of still another solar cell in accordance with some embodiments.

Referring to FIG. 13 and FIG. 16, in some embodiments, the functional layer 30 includes a second functional layer 32 covering the remaining surface of the monocrystal perovskite particle 1032 other than the first convex surface T1.

FIG. 16 is a cross-sectional view of a solar cell passing through a spherical center of the monocrystal perovskite particle 1032. In the solar cell preparation process, a functional film layer covering the entire surface of the monocrystal perovskite particle 1032 may be first formed on the surface of the monocrystal perovskite particle 1032, then the functional film layer on the first convex surface T1 of the monocrystal perovskite particle 1032 is removed, to obtain the second functional layer 32 covering the remaining surface of the monocrystal perovskite particle 1032 other than the first convex surface T1, and the second functional layer 32 is used as the functional layer 30 on the surface of the monocrystal perovskite particle 1032.

The second functional layer 32 covering the remaining surface of the monocrystal perovskite particle 1032 other than the first convex surface T1 is formed as the functional layer 30 on the surface of the monocrystal perovskite particle 1032, so that the stability of the monocrystal perovskite particle 1032 in the working process is ensured as much as possible, and light reflectivity of the first convex surface T1 is reduced, thereby ensuring that the monocrystal perovskite particle 1032 has a good light absorption capability, and further ensuring a carrier generation capability of the monocrystal perovskite particle 1032 and the photoelectric conversion capability of the solar cell.

It should be noted that in this embodiment of the present disclosure, an example in which the second functional layer 32 does not completely cover the first convex surface T1 is used for description. In specific application, in the process of forming the second functional layer 32, the second functional layer 32 may not completely cover the first convex surface T1, or the second functional layer 32 may cover only a part of the first convex surface T1. A specific arrangement manner may be adjusted according to a requirement for the stability and/or the light absorption capability of the monocrystal perovskite particle 1032. This is not limited in this embodiment of the present disclosure.

Figure 17:
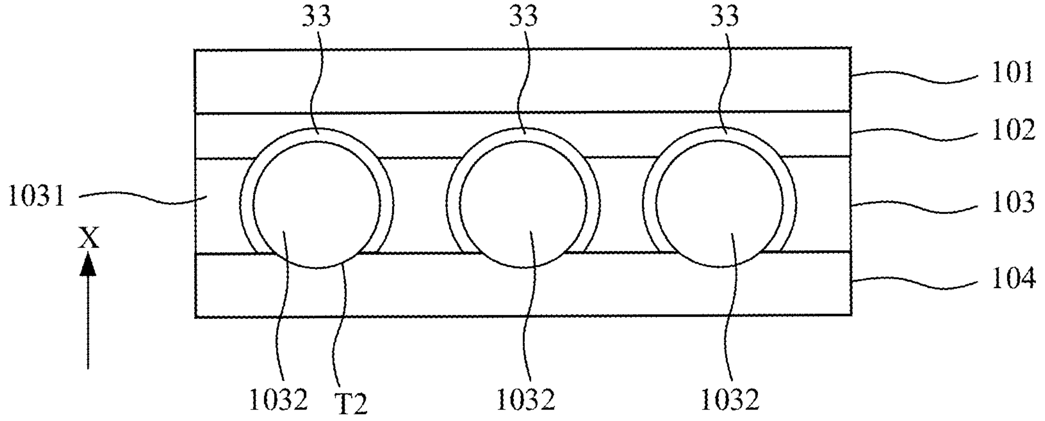
FIG. 17 is a schematic diagram illustrating a cross-sectional view of yet another solar cell in accordance with some embodiments.

Referring to FIG. 13 and FIG. 17, in some embodiments, the functional layer 30 includes a third functional layer 33 covering the remaining surface of the monocrystal perovskite particle 1032 other than the second convex surface T2.

FIG. 17 is a cross-sectional view of a solar cell passing through a spherical center of the monocrystal perovskite particle 1032. In the solar cell preparation process, a functional film layer covering the entire surface of the monocrystal perovskite particle 1032 may be first formed on the surface of the monocrystal perovskite particle 1032, then the functional film layer on the second convex surface T2 of the monocrystal perovskite particle 1032 is removed, to obtain the third functional layer 33 covering the remaining surface of the monocrystal perovskite particle 1032 other than the second convex surface T2, and the third functional layer 33 is used as the functional layer 30 on the surface of the monocrystal perovskite particle 1032.

The third functional layer 33 covering the remaining surface of the monocrystal perovskite particle 1032 other than the second convex surface T2 is formed as the functional layer 30 on the surface of the monocrystal perovskite particle 1032, so that the stability of the monocrystal perovskite particle 1032 in the working process is ensured as much as possible, and light reflectivity of the second convex surface T2 is reduced, thereby ensuring that the monocrystal perovskite particle 1032 has a good light absorption capability, and further ensuring a carrier generation capability of the monocrystal perovskite particle 1032 and the photoelectric conversion capability of the solar cell.

It should be noted that in this embodiment of the present disclosure, an example in which the third functional layer 33 does not completely cover the second convex surface T2 is used for description. In specific application, in the process of forming the third functional layer 33, the third functional layer 33 may not completely cover the second convex surface T2, or the third functional layer 33 may cover only a part of the second convex surface T2. A specific arrangement manner may be adjusted according to a requirement for the stability and/or the light absorption capability of the monocrystal perovskite particle 1032. This is not limited in this embodiment of the present disclosure.

Figure 18:
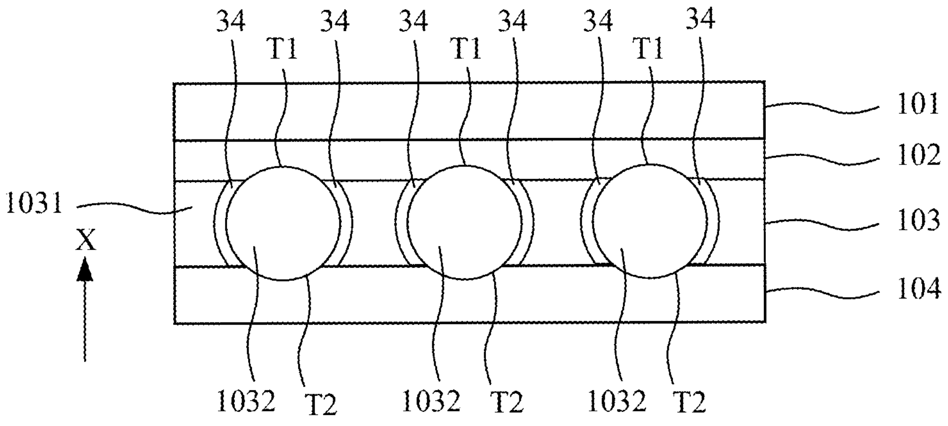
FIG. 18 is a schematic diagram illustrating a cross-sectional view of still another solar cell in accordance with some embodiments.

Referring to FIG. 13 and FIG. 18, in some embodiments, the functional layer 30 include a fourth functional layers 34 covering the remaining surface of the monocrystal perovskite particle 1032 other than the first convex surface T1 and the second convex surface T2.

FIG. 18 is a cross-sectional view of a solar cell passing through a spherical center of the monocrystal perovskite particle 1032. In the solar cell preparation process, a functional film layer covering the entire surface of the monocrystal perovskite particle 1032 may be first formed on the surface of the monocrystal perovskite particle 1032, then the functional film layer on the first convex surface T1 and the second convex surface T2 of the monocrystal perovskite particle 1032 is removed, to obtain the fourth functional layer 34 covering the remaining surface of the monocrystal perovskite particle 1032 other than the first convex surface T1 and the second convex surface T2, and the fourth functional layer 34 is used as the functional layer 30 on the surface of the monocrystal perovskite particle 1032.

The fourth functional layer 34 covering the remaining surface of the monocrystal perovskite particle 1032 other than the first convex surface T1 and the second convex surface T2 is formed as the functional layer 30 on the surface of the monocrystal perovskite particle 1032, so that the stability of the monocrystal perovskite particle 1032 in the working process is ensured to some extent, and light reflectivity of the first convex surface T1 and the second convex surface T2 is reduced, thereby ensuring that the monocrystal perovskite particle 1032 has a good light absorption capability, and further ensuring a carrier generation capability of the monocrystal perovskite particle 1032 and the photoelectric conversion capability of the solar cell.

Figure 19:
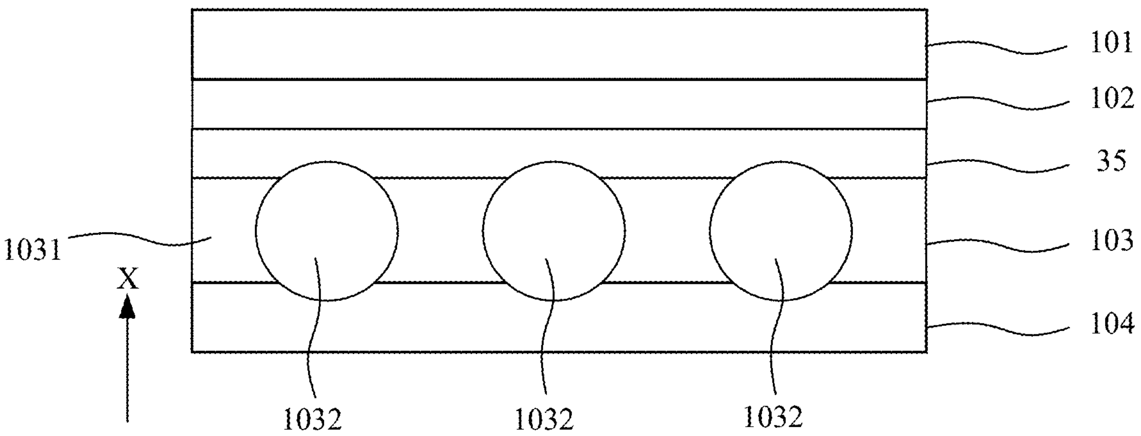
FIG. 19 is a schematic diagram illustrating a cross-sectional view of still another solar cell in accordance with some embodiments.

Referring to FIG. 13 and FIG. 19, in some embodiments, the functional layer 30 include a fifth functional layer 35 covering the first convex surface T1 and the first surface.

FIG. 19 is a cross-sectional view of a solar cell passing through a spherical center of the monocrystal perovskite particle 1032. In the solar cell preparation process, regardless of whether passivation processing or modification processing is performed on the surface of the monocrystal perovskite particle 1032, the fifth functional layer 35 is directly formed on a surface of the perovskite absorption layer 103 facing the first conductive layer 101, the fifth functional layer 35 covers the first surface of the bonding matrix 1031 and the first convex surface T1 of the monocrystal perovskite particle 1032, and the fifth functional layer 35 on the first convex surface T1 of the monocrystal perovskite particle 1032 is used as the functional layer 30 on the surface of the monocrystal perovskite particle 1032.

The fifth functional layer 35 covering the first surface of the bonding matrix 1031 and the first convex surface T1 of the monocrystal perovskite particle 1032 is used as the functional layer 30, so that the surface of the first convex surface T1 of the monocrystal perovskite particle 1032 has the functional layer 30, to improve the stability of the monocrystal perovskite particle 1032 in the working process. In addition, the fifth functional layer 35 covers the first surface of the bonding matrix 1031, so that reflectivity of light inside the bonding matrix 1031 is increased, and the light absorption capability of the perovskite absorption layer 103 is enhanced, thereby improving the photoelectric conversion capability of the solar cell.

It should be noted that the fifth functional layer 35 may be integrally formed on the surface of the perovskite absorption layer 103 directly and covers the first convex surface T1 of a respective monocrystal perovskite particle 1032, or may be selectively formed on the surface of the perovskite absorption layer 103 according to a specific pattern and does not cover all regions on the first convex surfaces T1 of all the monocrystal perovskite particles 1032 and the first surface of the bonding matrix 1031. The fifth functional layer 35 may cover the entire first convex surface T1 or may cover only a part of the first convex surface T1. This is not limited in this embodiment of the present disclosure.

Figure 20:
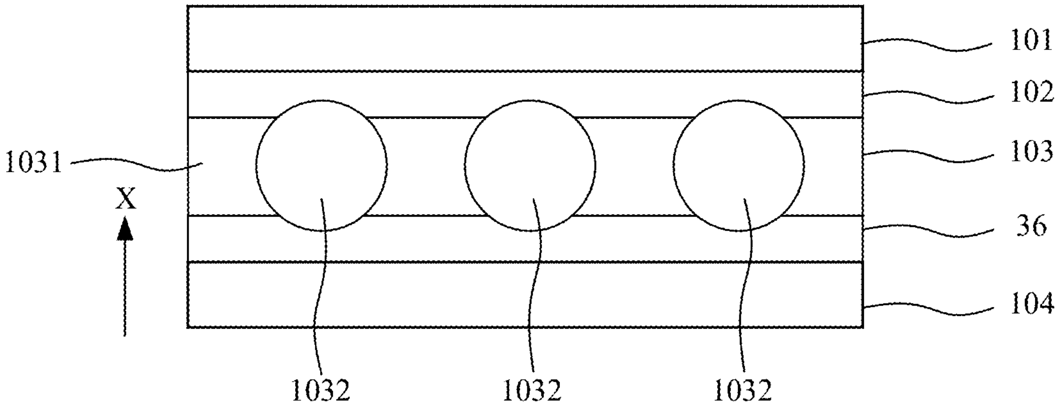
FIG. 20 is a schematic diagram illustrating a cross-sectional view of still another solar cell in accordance with some embodiments.

Referring to FIG. 13 and FIG. 20, in some embodiments, the functional layer 30 includes a sixth functional layer 36 covering the second convex surface T2 and the second surface.

FIG. 20 is a cross-sectional view of a solar cell passing through a spherical center of the monocrystal perovskite particle 1032. In the solar cell preparation process, regardless of whether passivation processing or modification processing is performed on the surface of the monocrystal perovskite particle 1032, the sixth functional layer 36 is directly formed on a second surface of the perovskite absorption layer 103 opposite to a first surface facing the first conductive layer 101 in the first direction, the sixth functional layer 36 covers the second surface of the bonding matrix 1031 and the second convex surface T2 of the monocrystal perovskite particle 1032, and the sixth functional layer 36 on the second convex surface T2 of the monocrystal perovskite particle 1032 is used as the functional layer 30 on the surface of the monocrystal perovskite particle 1032.

The sixth functional layer 36 covering the second surface of the bonding matrix 1031 and the second convex surface T2 of the monocrystal perovskite particle 1032 is used as the functional layer 30, so that the surface of the second convex surface T2 of the monocrystal perovskite particle 1032 has the functional layer 30, to improve the stability of the monocrystal perovskite particle 1032 in the working process. In addition, the sixth functional layer 36 covers the second surface of the bonding matrix 1031, so that reflectivity of light inside the bonding matrix 1031 is increased, and the light absorption capability of the perovskite absorption layer 103 is enhanced, thereby improving the photoelectric conversion capability of the solar cell.

It should be noted that the sixth functional layer 36 may be integrally formed on the surface of the perovskite absorption layer 103 directly and covers the second convex surface T2 of each monocrystal perovskite particle 1032, or may be selectively formed on the surface of the perovskite absorption layer 103 according to a specific pattern and does not cover all regions on the second convex surfaces T2 of all the monocrystal perovskite particles 1032 and the second surface of the bonding matrix 1031. The sixth functional layer 36 may cover the entire second convex surface T2 or may cover only a part of the second convex surface T2. This is not limited in this embodiment of the present disclosure.

Figure 21:
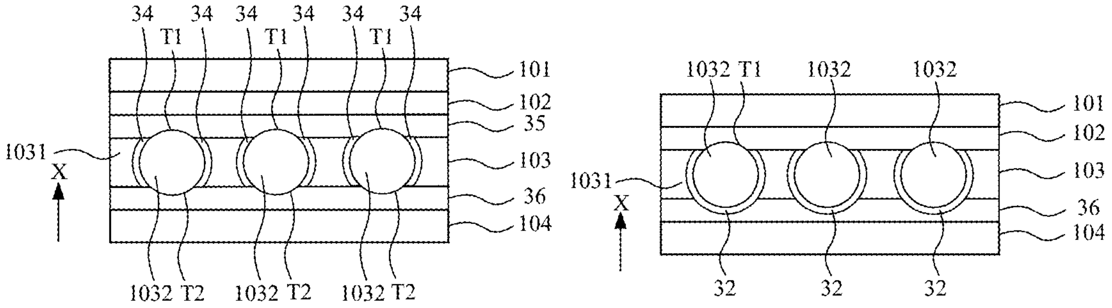
FIG. 21 is a schematic diagram illustrating cross-sectional views of two solar cells in accordance with some embodiments.

It should be understood that the arrangement manner of the functional layer 30 as described above may not only be implemented independently, but also may be implemented in combination with each other. Referring to FIG. 13 to FIG. 21, one of the two figures in FIG. 21 is a cross-sectional view of a solar cell in which the functional layer 30 is formed by the fourth functional layer 34 only covering the remaining surface of the monocrystal perovskite particle other than the first convex surface T1 and the second convex surface T2, the fifth functional layer 35 covering the first convex surface T1 and the first surface of the bonding matrix 1031, and the sixth functional layer 36 covering the second convex surface T2 and the second surface of the bonding matrix 1031, and the other of the two figures in is a cross-sectional view of a solar cell in which the functional layer 30 is formed by the second functional layer 32 covering the remaining surface of the monocrystal perovskite particle other than the first convex surface T1 and the sixth functional layer 36 covering the second convex surface T2 and the second surface of the bonding matrix 1031. The functional layer 30 may be formed by only any one of the first functional layer 31 to the sixth functional layer 36, the first functional layer 31 and the fifth functional layer 35 and/or the sixth functional layer 36, the second functional layer 32 and the fifth functional layer 35 and/or the sixth functional layer 36, the third functional layer 33 and the fifth functional layer 35 and/or the sixth functional layer 36, the fourth functional layer 34 and the fifth functional layer 35 and/or the sixth functional layer 36, or the fifth functional layer 35 and the sixth functional layer 36. A cross-sectional view of a solar cell in which the functional layer 30 is formed in a remaining construction manner is not shown one by one again.

In addition, in the process of constructing the first functional layer 31 to the sixth functional layer 36, a selected construction material may be further adjusted according to a specific type of a carrier transport layer with a largest contact area. The carrier transport layer includes an electron transport layer and a hole transport layer. When the carrier transport layer with the largest contact area is the electron transport layer, lithium fluoride (LiF) or magnesium fluoride ($MgF_2$) or the like may be selected as the construction material. When the carrier transport layer with the largest contact area is the hole transport layer, poly[(9,9-bis(3'-(N, N-dimethylamino)propyl fluorenyl-2,7-fluorene)-alt-[(9,9-dioctylfluorene 2,7-fluorene)-dibromine (PFN-Br) or poly [bis(4-phenyl)(4-butylphenyl)amine](TPD) may be selected as the construction material. When there is no large difference between contact areas of two different carrier transport layers, trimercapto-s-triazine trisodium salt (TTTS) may be selected as the construction material. A proper material is selectively selected according to contact areas of different carrier transport layers to construct the functional layer 30, to improve construction accuracy and a usage effect of the functional layer 30. A specific construction manner is not limited in this embodiment of the present disclosure.

In some embodiments, the functional layer 30 has a thickness in a range of 0.1 nm to 1 μm.

Referring to FIG. 15 to FIG. 21, the thickness of the functional layer 30 is associated with the composition of the functional layer 30. When the functional layer 30 includes the fifth functional layer 35 and/or the sixth functional layer 36, the thickness of the functional layer 30 may be represented by an average distance or a maximum distance between two opposite points on the fifth functional layer 35 and/or the sixth functional layer 36 in the first direction. When the functional layer 30 includes any one of the first functional layer 31 to the fourth functional layer 34, the thickness of the functional layer 30 may be represented by an average distance or a maximum distance between any point on a surface of the first functional layer 31, second functional layer 32, third functional layer 33, or fourth functional layer 34 away from the monocrystal perovskite particle 1032 and a surface of the monocrystal perovskite particle close to the functional layer 30.

When the thickness of the functional layer 30 is excessively large, the stability of the monocrystal perovskite particle 1032 can be effectively improved, but the light absorption capability of the monocrystal perovskite particle 1032 is reduced, and the photoelectric conversion capability of the solar cell is reduced. When the thickness of the functional layer 30 is excessively small, the light absorption capability of the monocrystal perovskite particle 1032 is ensured, but the decomposition probability is large, the stability of the solar cell cannot be ensured, and the improvement of the light absorption capability of the solar cell is relatively limited.

Therefore, the thickness of the functional layer 30 is set in a range of 0.1 nm to 1 μm, for example, set to 0.1 nm, 0.5 nm, 1 nm, 5 nm, 10 nm, 25 nm, 50 nm, 100 nm, 200 nm, 500 nm, 750 nm, or 900 nm. Through setting of the thickness of the functional layer 30, it is ensured that the monocrystal perovskite particle 1032 and the solar cell have good light absorption capabilities, and the photoelectric conversion capability of the solar cell is ensured while the stability of the solar cell is improved as much as possible.

In some embodiments, for a respective one of the monocrystal perovskite particles 1032, a distance between the respective monocrystal perovskite particle and an adjacent monocrystal perovskite particle 1032 is not greater than a maximum distance between any two points on a surface of the respective monocrystal perovskite particle 1032.

Referring to FIG. 14, two largest circles in the figure are circles formed in a horizontal direction through spherical centers of two adjacent monocrystal perovskite particles 1032. A maximum distance between any two points on a surface of a current monocrystal perovskite particle is marked as d, and a distance between the monocrystaltwo adjacent monocrystal perovskite particles 1032 is marked as D. D may represent a minimum value of the distance between any point on the surface of one of the two adjacent monocrystal perovskite particles and any point on the surface of the other of the two adjacent monocrystal perovskite particles 1032. When a distance between two adjacent monocrystal perovskite particles 1032 is excessively large, the light absorption capability of the perovskite absorption layer 103 in a region between the two adjacent monocrystal perovskite particles 1032 is extremely poor, which further causes the light absorption capability of the perovskite absorption layer 103 to decrease, and affects the photoelectric conversion capability of the perovskite absorption layer.

The ability of the monocrystal perovskite particle 1032 to absorb light decreases with the increase of a distance between light and the monocrystal perovskite particle. Therefore, the distance D between two adjacent monocrystal perovskite particles 1032 in the perovskite absorption layer 103 needs to be limited, and the distance D between the respective monocrystal perovskite particle and the adjacent monocrystal perovskite particle 1032 is set in a range less than a size of the respective perovskite particle, that is, set in a range less than the maximum distance d between any two points on the surface of the respective monocrystal perovskite particle, for example, set D to be equal to 0.1d, 0.2d, 0.35d, 0.45d, 0.5d, 0.75d, or 0.9d. The distance between the respective monocrystal perovskite particle and the adjacent monocrystal perovskite particle 1032 is set in a range not greater than the size of the respective monocrystal perovskite particle, so that the perovskite absorption layer 103 has a good light absorption capability, thereby avoiding a problem that the photoelectric conversion efficiency of the solar cell decreases due to the decrease of the light absorption capability.

In some embodiments, in the first direction, a distance between any point on the first convex surface and the first surface and/or a distance between any point on the second convex surface and the second surface is not greater than half of a maximum length of the monocrystal perovskite particle 1032 in the first direction.

Figure 22:
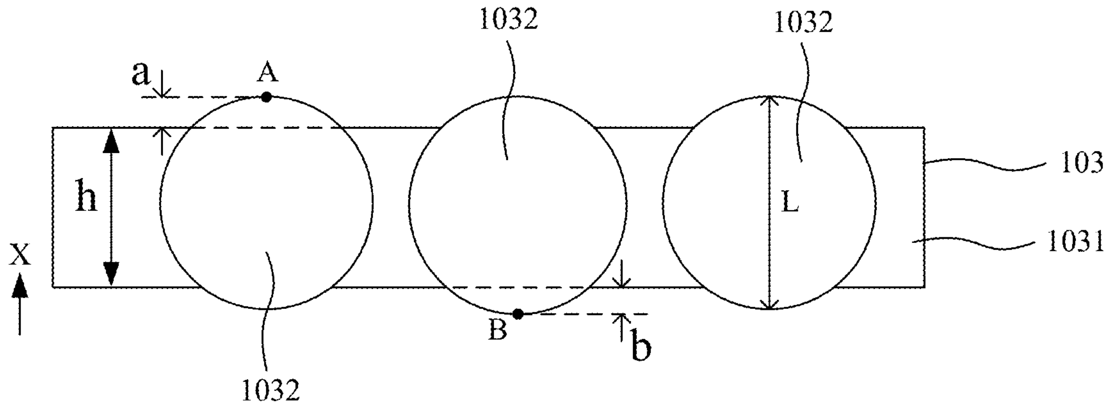
FIG. 22 is a schematic diagram illustrating a cross-sectional view of another perovskite absorption layer in accordance with some embodiments.

Referring to FIG. 13 and FIG. 22, FIG. 22 is a cross-sectional view of the perovskite absorption layer 103 formed through spherical centers of three monocrystal perovskite particles 1032 having a same size in a vertical direction. In the perovskite absorption layer 103, in the first direction, a maximum distance between any point on the first convex surface of the monocrystal perovskite particle 1032 and the first surface of the bonding matrix 1031 is a distance a between a point A on the first convex surface farthest from the first surface and the first surface. Similarly, a maximum distance between any point on the second convex surface of the monocrystal perovskite particle 1032 and the second surface of the bonding matrix 1031 is a distance b between a point B on the second convex surface farthest from the second surface and the second surface. A maximum length of the monocrystal perovskite particle 1032 is L.

In the process of constructing the perovskite absorption layer 103, the function of the bonding matrix 1031 is to fix the monocrystal perovskite particles 1032, and the bonding matrix 1031 has a specific thickness to ensure a fixing effect. When the monocrystal perovskite particle 1032 generates a carrier, different carriers are aggregated and move toward two ends of the monocrystal perovskite particle 1032 respectively. When the distance a between the point A on the first convex surface of the monocrystal perovskite particle 1032 and the first surface is greater than or equal to half of L and/or the distance b between the point B on the second convex surface and the second surface is greater than or equal to half of L, the carriers aggregated on the first carrier transport layer 102 or the second conductive layer 104 may be recombined with carriers of opposite polarity, resulting in reduction in the photoelectric conversion efficiency of the perovskite absorption layer 103.

Therefore, in the process of constructing the perovskite absorption layer 103, for the monocrystal perovskite particle 1032 including the first convex surface and the second convex surface, in the first direction, it is ensured that the distance between any point on the first convex surface of the monocrystal perovskite particle 1032 and the first surface and/or the distance between any point on the second convex surface and the second surface is not greater than half of a maximum length of the monocrystal perovskite particle 1032 in the first direction. For example, the distance a and/or the distance b is set to 0.1 L, 0.15 L, 0.2 L, 0.25 L, 0.35 L, 0.45 L, or 0.49 L. The distance between any point on the first convex surface of the monocrystal perovskite particle 1032 and the first surface and/or the distance between any point on the second convex surface and the second surface is limited, to reduce a recombination probability of carriers of opposite polarities as much as possible and ensure the photoelectric conversion efficiency of the solar cell.

In some embodiments, a maximum distance between any two points on a surface of the monocrystal perovskite particle 1032 is in a range of 5 μm to 100 μm.

In the process of constructing the perovskite absorption layer 103, if a size of a selected monocrystal perovskite particle 1032 is excessively large, that is, when a maximum distance d between any two points on a surface of the particle is excessively large, after a perovskite absorption layer is constructed by using the monocrystal perovskite particle 1032, after carriers are generated by absorbing light energy, a distance that the carriers needs to move in a process of migrating to the first carrier transport layer 102 or the second conductive layer 104 is excessively large. Consequently, it is difficult to complete carrier migration, and the photoelectric conversion efficiency of the solar cell is further reduced. If the size of the monocrystal perovskite particle 1032 is excessively small, that is, when the maximum distance d between any two points on the surface of the particle is excessively small, in a carrier migration process, a distance between different carriers is small. Therefore, recombination of the carriers is easy to occur, resulting in reduction in the photoelectric conversion efficiency of the solar cell. In addition, when the size of the monocrystal perovskite particle 1032 is excessively small, the thickness of the perovskite absorption layer 103 is also small, a decomposition probability of the monocrystal perovskite particle 1032 is greatly increased under an action of a potential difference between two sides, resulting in reduction of the stability of the solar cell.

Therefore, in the process of constructing the perovskite absorption layer 103, a monocrystal perovskite particle 1032 with a maximum distance in a range of 5 μm to 100 μm between any two points on a surface of the particle is selected for construction. For example, a monocrystal perovskite particle 1032 with a maximum distance of 5 μm, 7.5 μm, 10 μm, 15 μm, 25 μm, 60 μm, 80 μm, 85 μm, or 95 μm between any two points on a surface of the particle is selected for constructing the perovskite absorption layer 103. It is ensured that the carriers in the perovskite absorption layer 103 can be easily migrated, and a recombination probability between different carriers and the decomposition probability of the monocrystal perovskite particle 1032 are reduced, thereby ensuring the photoelectric conversion efficiency and stability of the solar cell.

In some embodiments, an area of an orthographic projection of the perovskite absorption layer 103 on the first conductive layer 101 is a first area, an area of an orthographic projection of the plurality of monocrystal perovskite particles 1032 on the first conductive layer 101 is a second area, and a ratio of the second area to the first area is in a range of 0.3 to 0.9.

In the process of constructing the perovskite absorption layer 103, a light absorption area when the perovskite absorption layer 103 performs photoelectric conversion may be considered as a sum of orthographic projection areas of all the monocrystal perovskite particles 1032 on the first conductive layer 101, that is, the second area. An area for the perovskite absorption layer 103 to receive light may be considered as an orthographic projection area of the perovskite absorption layer 103 on the first conductive layer 101, that is, the first area. When the ratio of the second area to the first area is excessively small, the perovskite absorption layer 103 has low absorption utilization on light irradiated on the perovskite absorption layer 103, which results in a weak photoelectric conversion capability of the solar cell and is difficult to effectively perform photoelectric conversion. Due to the limitation of the photoelectric conversion capability of the monocrystal perovskite particle 1032, the perovskite absorption layer 103 has an upper limit on absorption utilization on light irradiated on the perovskite absorption layer 103. When the ratio of the second area to the first area is excessively large, the perovskite absorption layer 103 has the monocrystal perovskite particle 1032 of which the photoelectric conversion capability is not fully used, and a cost/performance ratio between the manufacturing cost of the solar cell and the photoelectric conversion capability is relatively low.

Therefore, in the process of constructing the perovskite absorption layer 103, a ratio of an area of an orthographic projection of the monocrystal perovskite particles 1032 in the perovskite absorption layer 103 on the first conductive layer 101 to the area of the orthographic projection of the perovskite absorption layer 103 on the first conductive layer 101 needs to be limited. The ratio of the second area to the first area is controlled to be within a range of 0.3 to 0.9, for example, 0.3, 0.35, 0.45, 0.5, 0.65, 0.7, 0.75. 0.8, or 0.85. A sum of the areas of the orthographic projections of the monocrystal perovskite particles 1032 on the first conductive layer 101 and the area of the orthographic projection of the perovskite absorption layer 103 on the first conductive layer 101 are limited in a specific range, to ensure the absorption utilization of the perovskite absorption layer 103 on the light and reduce the preparation costs of the solar cell as much as possible.

In addition, in the process of constructing the perovskite absorption layer 103, reference may be made to a light transmission requirement on a top cell when a tandem solar cell is constructed by using the perovskite cell as the top cell. According to a type of a bottom cell and optimal photoelectric conversion efficiency of the tandem solar cell, a ratio of an illumination area required by the bottom cell to an area of a light receiving surface of the bottom cell is determined when the tandem solar cell has the optimal or good photoelectric conversion efficiency. The ratio of the second area to the first area in the perovskite absorption layer 103 is set according to the determined ratio. For example, when areas of light receiving surfaces of the bottom cell and the top cell are consistent, and 30%, 50%, or 70% light needs to be transmitted through the top cell to the bottom cell, the tandem solar cell has the optimal photoelectric conversion efficiency, and thus the ratio of the second area to the first area in the perovskite absorption layer 103 may be correspondingly set to 0.7, 0.5, and 0.3 respectively.

In addition, to ensure the photoelectric conversion capability of the solar cell, the monocrystal perovskite particle 1032 with a bandgap in a range of 1 eV to 2 eV may be selected to construct the perovskite solar cell. When the tandem solar cell is constructed by using the perovskite cell as the top cell, the photoelectric conversion efficiency of the tandem solar cell is further related to the bandgap of the monocrystal perovskite particles 1032 in the top cell. In a process of constructing the tandem solar cell, the monocrystal perovskite particles 1032 with a bandgap in a range of 1.4 eV to 1.8 eV may be selected according to the type of the bottom cell to construct the perovskite cell. In a process of selecting the monocrystal perovskite particles 1032, as long as the tandem solar cell has good photoelectric conversion efficiency, a specific bandgap of the selected monocrystal perovskite particle 1032 is not limited in this embodiment of the present disclosure.

Therefore, in the process of constructing the tandem solar cell, the ratio of the second area to the first area in the perovskite absorption layer 103 in the perovskite solar cell and the bandgap of the monocrystal perovskite particle 1032 can be respectively controlled according to a requirement in which the tandem solar cell achieves good photoelectric conversion efficiency to improve the photoelectric conversion efficiency of the tandem solar cell as much as possible.

It should be noted that the plurality of monocrystal perovskite particles 1032 may include perovskite particles having no first convex surface and/or second convex surface, and photo-generated carriers generated in the monocrystal perovskite particles 1032 including neither the first convex surface nor the second convex surface are difficult to complete carrier migration due to the limitation of the bonding matrix 1031. To further ensure light utilization of the perovskite absorption layer 103, when the second area is calculated, only a sum of areas of orthographic projections of the monocrystal perovskite particles 1032 including the first convex surface and the second convex surface on the first conductive layer 101 may be calculated. Alternatively, orthographic projections of all the monocrystal perovskite particles 1032 having the first convex surfaces and/or the second convex surface on the first conductive layer 101 may be counted. This is not limited in this embodiment of the present disclosure.

In some embodiments, the bonding matrix 1031 has a thickness not less than 100 nm.

Referring to FIG. 13 and FIG. 22, the thickness h of the bonding matrix 1031 may be represented by using a distance between two opposite points on the first surface and the second surface of the bonding matrix 1031 in the first direction. An important function of the bonding matrix 1031 is to fix the monocrystal perovskite particles 1032 arranged in the bonding matrix 1031. Therefore, when the thickness h of the bonding matrix 1031 in the first direction is excessively small, it is difficult to stably fix the monocrystal perovskite particles 1032, and a problem such as a crack may occur, resulting in reduction in the stability of the solar cell. In addition, a distance between different carriers may be excessively small, resulting in recombination of different carriers, and further resulting in reduction in the photoelectric conversion efficiency of the solar cell.

Therefore, in a process of manufacturing the bonding matrix 1031, it is necessary to ensure that the thickness h of the bonding matrix 1031 in the first direction is not less than 100 nm, for example, 100 nm, 200 nm, 350 nm, 500 nm, 800 nm, 1 μm, 5 μm, 20 μm, or 50 μm. The thickness of the bonding matrix 1031 in the first direction is set sufficiently large to ensure that the bonding matrix 1031 can stably fix the monocrystal perovskite particles 1032, avoid failure of the perovskite absorption layer 103, and improve the stability of the solar cell. In addition, it is ensured that the distance between different carriers is sufficiently large to avoid recombination of different carriers, and ensure the photoelectric conversion efficiency of the solar cell.

In addition, when the thickness h of the bonding matrix 1031 is excessively large in the first direction, to enable the monocrystal perovskite particle 1032 to have the first convex surface and the second convex surface, the size of the monocrystal perovskite particle 1032, that is, a maximum distance between any two points on the surface of the particle, is also increased, which increases the difficulty in migrating the photo-generated carriers generated by the monocrystal perovskite particle 1032, and further causes reduction in the photoelectric conversion efficiency of the solar cell.

Therefore, in a process of arranging the bonding matrix 1031, a fixing effect and a carrier isolation effect of the bonding matrix 1031 for the monocrystal perovskite particles 1032 need to be considered, and an impact of the bonding matrix 1031 on the photoelectric conversion capability of the selected monocrystal perovskite particles 1032 needs to be also considered. The thickness h of the bonding matrix 1031 in the first direction is set to a range less than a size of the monocrystal perovskite particle 1032 with good photoelectric conversion efficiency, to ensure that the perovskite absorption layer 103 has good photoelectric conversion efficiency as much as possible.

Referring to FIG. 13, and FIG. 23 to FIG. 25, in some embodiments, the bonding matrix 1031 includes a light trapping surface 1033 facing the first carrier transport layer 102 and/or facing the second conductive layer 104.

Figure 23:
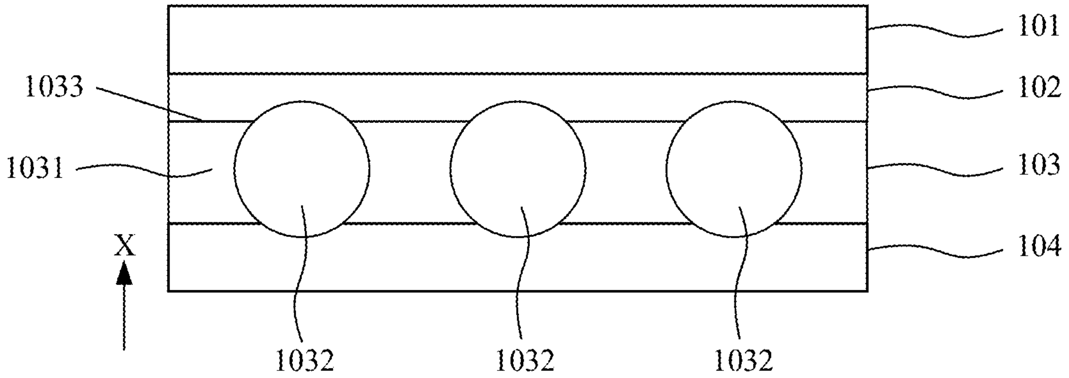
FIG. 23 is a schematic diagram illustrating a cross-sectional view of still another solar cell in accordance with some embodiments.
Figure 24:
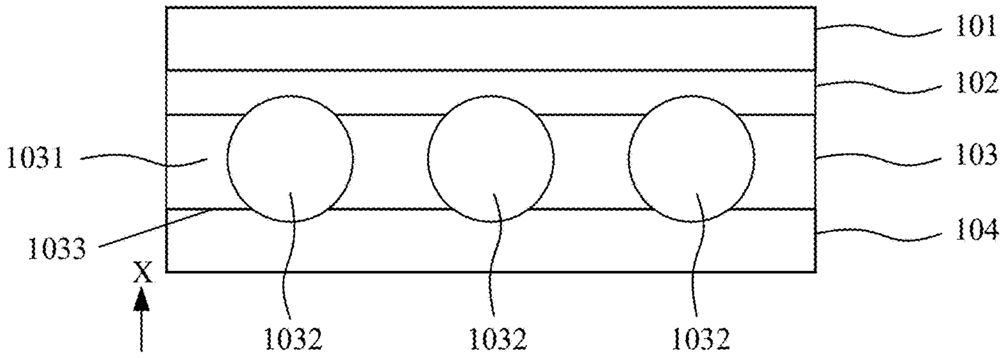
FIG. 24 is a schematic diagram illustrating a cross-sectional view of still another solar cell in accordance with some embodiments.
Figure 25:
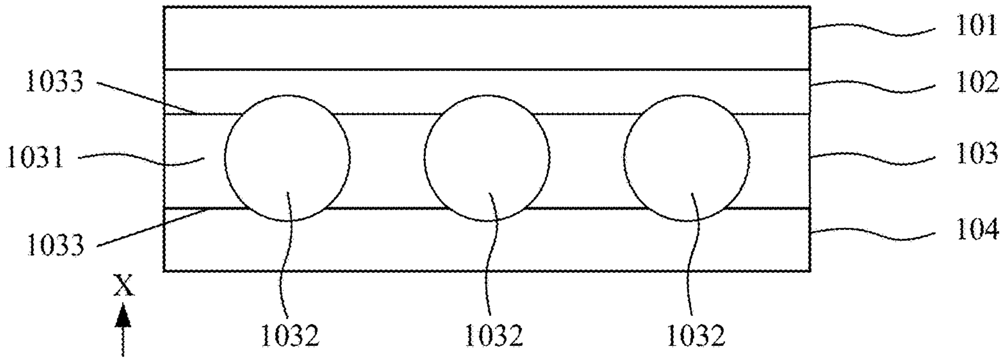
FIG. 25 is a schematic diagram illustrating a cross-sectional view of still another solar cell in accordance with some embodiments.

FIG. 23 to FIG. 25 are all cross-sectional views of a solar cell in a vertical direction. In FIG. 23, the light trapping surface 1033 includes only a surface of the bonding matrix 1031 facing the first carrier transport layer 102. In FIG. 24, the light trapping surface 1033 includes only a surface of the bonding matrix 1031 facing the second conductive layer 104. In FIG. 25, the light trapping surface 1033 includes the surface of the bonding matrix 1031 facing the first carrier transport layer 102 and the surface facing the second conductive layer 104. Another important function of the bonding matrix 1031 is to ensure a light absorption capability of the perovskite absorption layer 103. Therefore, in the process of manufacturing the bonding matrix 1031, the light trapping surface 1033 that improves the light absorption capability of the perovskite absorption layer 103 may be further manufactured on the bonding matrix 1031. In the manufacturing process, the light trapping surface 1033 may include only the surface of the bonding matrix 1031 facing the first carrier transport layer 102, or include only the surface of the bonding matrix 1031 facing the second conductive layer 104, or include both the surface of the bonding matrix 1031 facing the first carrier transport layer 102 and the surface facing the second conductive layer 104.

The light trapping surface 1033 facing the first carrier transport layer 102 and/or the second conductive layer 104 is formed on the bonding matrix 1031, so that a light path of light irradiated on the perovskite absorption layer 103 in the perovskite absorption layer 103 is increased, to improve the light absorption capability of the perovskite absorption layer 103, thereby improving the photoelectric conversion efficiency of the perovskite absorption layer 103 and the solar cell.

Figure 26:
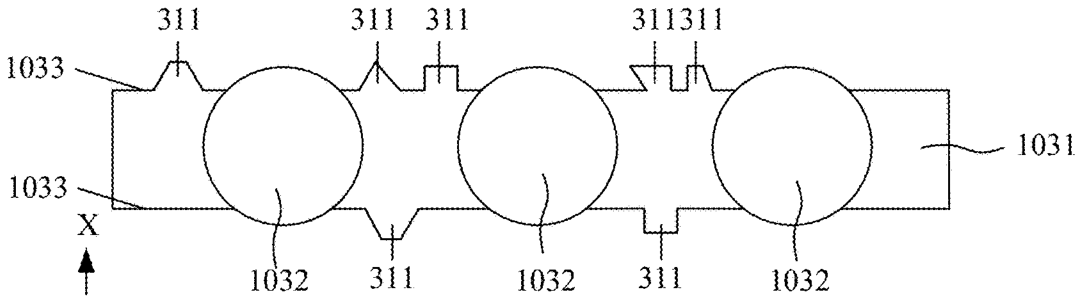
FIG. 26 is a schematic diagram illustrating a cross-sectional view of still another solar cell in accordance with some embodiments.

Referring to FIG. 13 and FIG. 26, in some embodiments, the light trapping surface 1033 includes a first light trapping structure 311, and in the first direction, the first light trapping structure 311 extends to the outside of the bonding matrix 1031.

FIG. 26 is a cross-sectional view of a solar cell in which the light trapping surface 1033 includes both the surface of the bonding matrix 1031 facing the first carrier transport layer and the surface facing the second conductive layer 104 and the light trapping surface 1033 includes the first light trapping structure 311. In a process of manufacturing the light trapping surface 1033 on the bonding matrix 1031, the first light trapping structure 311 may be formed on the surface of the bonding matrix 1031 facing the first carrier transport layer 102 and/or facing the second conductive layer 104, that is, one or more protrusions extending in a direction away from the bonding matrix 1031 are formed on the first surface or the second surface. The first light trapping structure 311 is located on the first surface and/or the second surface, a position relationship between any surface of the first light trapping structure 311 and the first convex surface and/or the second convex surface of each monocrystal perovskite particle 1032 in the perovskite absorption layer 103 is tangent or separated, and the first light trapping structure 311 does not affect a contact area between the first convex surface and the first carrier transport layer 102 and a contact area between the second convex surface and the second conductive layer 104.

One or more protrusions extending in the direction away from the bonding matrix 1031 are formed on the first surface and/or the second surface as the first light trapping structures 311, so that the first surface and/or the second surface is changed into the light trapping surface 1033 that has a capability of extending a light path of incident light in the perovskite absorption layer 103, to improve an absorption and utilization capability of the perovskite absorption layer 103 on the incident light, thereby improving the photoelectric conversion capability and efficiency of the perovskite absorption layer 103.

It should be noted that shapes and a sizes of the first light trapping structures 311 may be the same or may be different. This is not limited in this embodiment of the present disclosure.

Figure 27:
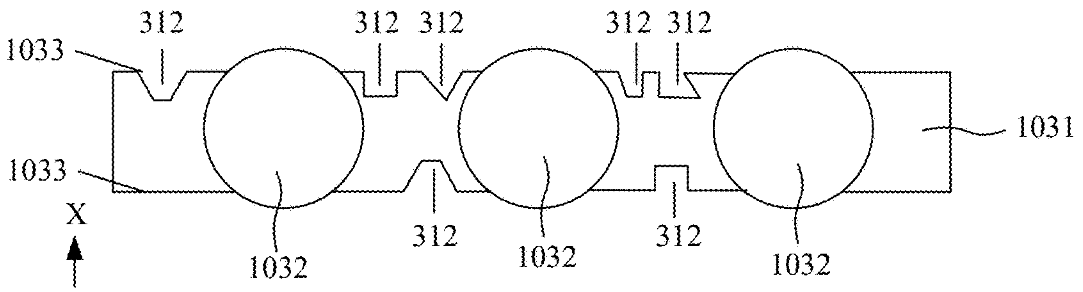
FIG. 27 is a schematic diagram illustrating a cross-sectional view of still another solar cell in accordance with some embodiments.

Referring to FIG. 13 and FIG. 27, in some embodiments, the light trapping surface 1033 includes a second light trapping structure 312, and in the first direction, the second light trapping structure 312 is recessed to the inside of the bonding matrix 1031.

FIG. 27 is a cross-sectional view of a solar cell in which the light trapping surface 1033 includes both the surface of the bonding matrix 1031 facing the first carrier transport layer and the surface facing the second conductive layer 104 and the light trapping surface 1033 includes the second light trapping structure 312. In the process of manufacturing the light trapping surface 1033 on the bonding matrix 1031, the second light trapping structure 312 may be formed on the surface of the bonding matrix 1031 facing the first carrier transport layer 102 and/or facing the second conductive layer 104, that is, one or more recesses extending to the inside of the bonding matrix 1031 are formed on the first surface or the second surface. The second light trapping structure 312 is located on the first surface and/or the second surface, a position relationship between any surface of the second light trapping structure 312 and a surface of each monocrystal perovskite particle 1032 in the perovskite absorption layer 103 located inside the bonding matrix 1031 is tangent or separated, and the second light trapping structure 312 does not affect a contact area between the monocrystal perovskite particle 1032 and the bonding matrix 1031.

One or more recesses extending to the inside of the bonding matrix 1031 are formed on the first surface or the second surface as the second light trapping structures 312, so that the first surface and/or the second surface is changed into the light trapping surface 1033 that has a capability of extending a light path of incident light in the perovskite absorption layer 103, to improve an absorption and utilization capability of the perovskite absorption layer 103 on the incident light, thereby improving the photoelectric conversion capability and efficiency of the perovskite absorption layer 103.

It should be noted that the light trapping surface 1033 may include only one or more first light trapping structures 311, or may include only one or more second light trapping structures 312, or may include one or more first light trapping structures 311 and one or more second light trapping structures 312. The light trapping surface 1033 may include only the surface of the bonding matrix 1031 facing the first carrier transport layer 102, or may include only the surface of the bonding matrix 1031 facing the second conductive layer 104, or may include both the surface of the bonding matrix 1031 facing the first carrier transport layer 102 and the surface of the bonding matrix 1031 facing the second conductive layer 104. Specific arrangement of the light trapping surface 1033 and a type and a quantity of light trapping structures included in the light trapping surface 1033 are not limited in this embodiment of the present disclosure.

It should be noted that shapes and sizes of the second light trapping structures 312 may be the same or may be different. This is not limited in this embodiment of the present disclosure.

In some embodiments, the first carrier transport layer 102 is an electron transport layer or a hole transport layer.

A function of the first carrier transport layer 102 is to collect and transmit carriers generated in the perovskite absorption layer 103. Based on a working principle of the solar cell, the first carrier transport layer 102 may be the hole transport layer or may be the electron transport layer. When the first carrier transport layer 102 is the electron transport layer, the function of the first carrier transport layer 102 includes aggregating electrons, transmitting the aggregated electrons to the first conductive layer 101 for the first conductive layer 101 to perform power output, and preventing holes from directly flowing to the first conductive layer 101. When the first carrier transport layer 102 is the hole transport layer, the function of the first carrier transport layer 102 includes preventing the electrons from entering the first conductive layer 101 and enhancing transport of the holes, to prevent the perovskite absorption layer 103 from being in direct contact with the first conductive layer 101. The photoelectric conversion capability and power output of the solar cell are ensured.

It should be noted that the electron transport layer may be made of materials including tin oxide (SnOx), titanium dioxide ($TiO_2$), and fullerene and its derivation such as $C_{60}$ and PCBM. The hole transport layer may be made of a material such as poly[bis(4-phenyl)(2,4,6-trimethylbenzyl) amine](PTAA), 2,2',7,7'-tetra[N,N-bis(4-methoxyphenyl) amino]-9,9'-spirobifluorene (spiro-OMeTAD), nickel oxide (NiOx), or cuprous rhodanide (CuSCN).

In some embodiments, in the first direction, the first carrier transport layer 102 has a thickness in a range of 1 nm to 1 μm.

A core function of the first carrier transport layer 102 is to improve aggregation and transport capabilities for one type of carriers and also isolate contact between another type of carriers and the first conductive layer 101. Therefore, when the thickness of the first carrier transport layer 102 in the first direction is excessively large, a migration distance is excessively large when the carrier is transmitted to the first conductive layer 101, carrier recombination may occur, resulting in a relatively large carrier loss and reduction in the photoelectric conversion efficiency of the solar cell. When the thickness of the first carrier transport layer 102 in the first direction is excessively small, the first carrier transport layer 102 has limited aggregation and transport capabilities for the carriers, and cannot aggregate and transmit all carriers of a specific type generated by the perovskite absorption layer 103 in time, resulting in a relatively large carrier loss and affecting the photoelectric conversion efficiency of the solar cell. In addition, when the thickness is excessively small, an isolation capability for another type of carriers is also reduced, resulting in recombination of carriers of different types and further affecting the photoelectric conversion efficiency of the solar cell.

Therefore, in a process of constructing the first carrier transport layer 102, the thickness of the first carrier transport layer 102 in the first direction is set to between 1 nm and 1 μm, for example, set to 1 nm, 5 nm, 10 nm, 50 nm, 100 nm, 200 nm, 250 nm, 400 nm, 500 nm, 650 nm, 750 nm, 800 nm, or 950 nm. It is ensured that the first carrier transport layer 102 has sufficiently large aggregation and transport capabilities for a type of carriers, and has a sufficiently large isolation capability for another type of carriers, so as to reduce the carrier loss caused by carrier recombination and migration, and ensure the photoelectric conversion efficiency of the solar cell.

Figure 28:
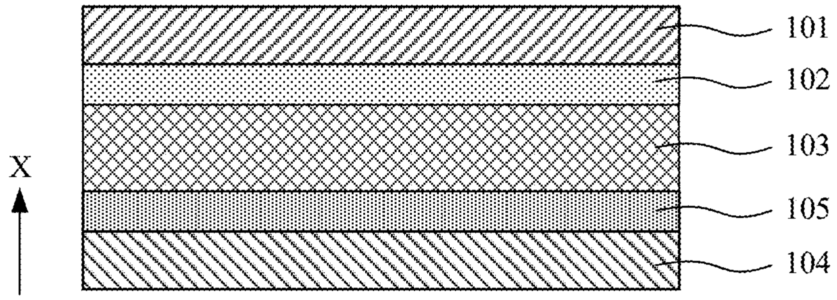
FIG. 28 is a schematic diagram illustrating another solar cell in accordance with some embodiments.

Referring to FIG. 28, in some embodiments, the solar cell further includes: a second carrier transport layer 105, where the second carrier transport layer 105 is located between the perovskite absorption layer 103 and the second conductive layer 104 and is in contact with the perovskite absorption layer 103 and the second conductive layer 104 respectively.

A function of the second carrier transport layer 105 is similar to that of the first carrier transport layer 102 and is to collect and transmit carriers generated in the perovskite absorption layer 103. Based on the working principle of the solar cell, the second carrier transport layer 105 may be a hole transport layer or may be an electron transport layer. When the second carrier transport layer 105 is the electron transport layer, the function of the second carrier transport layer 105 includes aggregating electrons, transmitting the aggregated electrons to the first conductive layer 101 for the first conductive layer 101 to perform power output, and preventing holes from directly flowing to the first conductive layer 101. When the second carrier transport layer 105 is the hole transport layer, the function of the second carrier transport layer 105 includes preventing the electrons from entering the first conductive layer 101 and enhancing transport of the holes, to prevent the perovskite absorption layer 103 from being in direct contact with the first conductive layer 101. The photoelectric conversion capability and power output of the solar cell are ensured.

In some embodiments, in the first direction, the second carrier transport layer 105 has a thickness in a range of 1 nm to 1 μm.

A core function of the second carrier transport layer 105 is to improve aggregation and transport capabilities for one type of carriers and also isolate contact between another type of carriers and the first conductive layer 101. Therefore, when the thickness of the second carrier transport layer 105 in the first direction is excessively large, a migration distance is excessively large when the carriers are transmitted to the second conductive layer 104, carrier recombination may occur, resulting in a relatively large carrier loss and reduction in the photoelectric conversion efficiency of the solar cell. When the thickness of the second carrier transport layer 105 in the first direction is excessively small, the second carrier transport layer 105 has limited aggregation and transport capabilities for the carriers, and cannot aggregate and transmit all carriers of a specific type generated by the perovskite absorption layer 103 in time, resulting in a relatively large carrier loss and affecting the photoelectric conversion efficiency of the solar cell. In addition, when the thickness is excessively small, an isolation capability for another type of carriers is also reduced, resulting in recombination of carriers of different types and further affecting the photoelectric conversion efficiency of the solar cell.

Therefore, in a process of constructing the second carrier transport layer 105, the thickness of the second carrier transport layer 105 in the first direction is set to between 1 nm and 1 μm, for example, set to 1 nm, 5 nm, 10 nm, 50 nm, 100 nm, 200 nm, 250 nm, 400 nm, 500 nm, 650 nm, 750 nm, 800 nm, or 950 nm. It is ensured that the second carrier transport layer 105 has sufficiently large aggregation and transport capabilities for one type of carriers, and has a sufficiently large isolation capability for another type of carriers, so as to reduce the carrier loss caused by carrier recombination and migration, and ensure the photoelectric conversion efficiency of the solar cell.

In some embodiments, when the first carrier transport layer 102 is the hole transport layer, the second carrier transport layer 105 is the electron transport layer; and when the first carrier transport layer 102 is the electron transport layer, the second carrier transport layer 105 is the hole transport layer.

To further improve the efficiency of the solar cell, carrier transport layers for aggregating and transmitting different carriers may be arranged on two opposite sides of the perovskite absorption layer 103 in the first direction respectively, to improve the photoelectric conversion efficiency and stability of the solar cell as much as possible.

Based on the foregoing, in the solar cell provided in this embodiment of the present disclosure, the perovskite absorption layer 103 of the solar cell is formed by the bonding matrix 1031 and the plurality of monocrystal perovskite particles 1032 arranged in the bonding matrix 1031. The perovskite absorption layer 103 is constructed by using the monocrystal perovskite particles 1032, so as to ensure stability of the perovskite absorption layer 103. The monocrystal perovskite particles 1032 are arranged in the bonding matrix 1031, so as to avoid damage to monocrystal perovskite by a cutting process and ensures efficiency of the solar cell. In addition, the perovskite absorption layer 103 is constructed in a monocrystal particle arrangement manner to facilitate preparation of a large-area monocrystal perovskite solar cell. In the plurality of monocrystal perovskite particles 1032 arranged in the bonding matrix 1031, at least some of the monocrystal perovskite particles 1032 have the first convex surfaces protruding relative to the first surface of the bonding matrix 1031 and the second convex surfaces protruding relative to the second surface of the bonding matrix 1031 respectively. The perovskite absorption layer 103 is constructed by using the monocrystal perovskite particles 1032 exposed on two opposite surfaces of the bonding matrix 1031, so that the perovskite absorption layer 103 has a texturing structure, and thus has a good light absorption capability. In addition, a capability of transmitting a photo-generated carrier from the perovskite absorption layer 103 to a conductive layer or a carrier transport layer is improved, and photoelectric conversion efficiency and a photoelectric conversion capability of the solar cell are improved. The functional layer 30 is formed on the surface of the monocrystal perovskite particle 1032, to improve the stability of the perovskite absorption layer 103 and the solar cell.

It is not difficult to find that this embodiment is a solar cell structure embodiment corresponding to the solar cell preparation method embodiment. The details in this embodiment are also applicable to the solar cell preparation method embodiment, and the details in the solar cell preparation method embodiment are also applicable to this embodiment.

Figure 29:
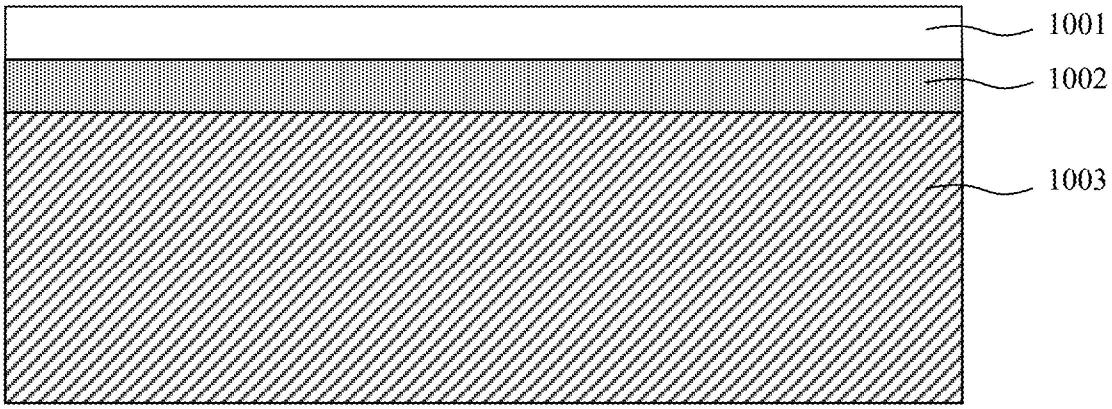
FIG. 29 is a schematic diagram illustrating a tandem solar cell in accordance with some embodiments.

Correspondingly, another embodiment of the present disclosure further provides a tandem solar cell. FIG. 29 is a schematic diagram illustrating a structure of a tandem solar cell. The tandem solar cell includes: a top cell 1001, a bonding layer 1002, and a bottom cell 1003 that are stacked in sequence, where the top cell 1001 is the solar cell as described above.

In some embodiments, a type of the bottom cell 1003 includes a crystalline silicon solar cell, a Copper Indium Gallium Selenium (CIGS) thin film solar cell, a cadmium telluride thin film solar cell, a III-V thin film solar cell, or a narrow band gap perovskite thin film solar cell. The narrow band gap perovskite thin film solar cell may be a narrow band gap monocrystal perovskite thin film solar cell or may be a narrow band gap polycrystal perovskite thin film solar cell.

In some embodiments, the bonding layer 1002 includes a mechanical bonding layer formed by a conductive adhesive. The conductive adhesive may be formed by adding conductive particles to transparent glue with good light transmittance, for example, adding the conductive particles to glue with 80% or more transmittance for 400 nm or more light or glue with 80% or more transmittance for 450 nm or more light. The conductive adhesive may alternatively be transparent thin glue which has particles with specific conductive energy, and has a degree transparency similar to a transparency degree of the glue as described above. Details are not described herein again. A specific type of the conductive adhesive is not limited in this embodiment of the present disclosure.

Although the present disclosure has been described with reference to exemplary embodiments, the embodiments are not intended to limit the claims. Any person skilled in the art can make possible changes and modifications without departing from the concept of the present disclosure. Therefore, the protection scope of the present disclosure should be subject to the scope defined by the claims of the present disclosure.

A person of ordinary skill in the art can understand that the foregoing implementations are specific embodiments for implementing the present disclosure, and in an actual application, various changes can be made in terms of form and details without departing from the spirit and scope of the present disclosure. Any person skilled in the art can make various changes and modifications without departing from the spirit and the scope of the present disclosure, and therefore the protection scope of the present disclosure should be subject to the scope defined by the claims.

What is claimed is:

1. A method for preparing a solar cell, comprising:

providing a carrier plate having a separation auxiliary layer formed thereon;

forming a perovskite absorption layer over a surface of the separation auxiliary layer facing away from the carrier plate, wherein the perovskite absorption layer has a first side facing away from the separation auxiliary layer and a second side opposite to the first side, and includes a bonding matrix and a plurality of monocrystal perovskite particles arranged in the bonding matrix, at least some of the plurality of monocrystal perovskite particles have respective first convex surfaces protruding from the bonding matrix on the first side of the perovskite absorption layer and respective second convex surfaces protruding from the bonding matrix on the second side of the perovskite absorption layer, and a functional layer is formed on a surface of each respective monocrystal perovskite particle of a portion of the plurality of monocrystal perovskite particles;

forming a first carrier transport layer on the first side of the perovskite absorption layer;

forming a first conductive layer over a surface of the first carrier transport layer facing away from the perovskite absorption layer; and removing the carrier plate and the separation auxiliary layer to expose the second side of the perovskite absorption layer, and forming a second conductive layer on the second side of the perovskite absorption layer.

2. The method according to claim 1, wherein the functional layer is formed by:

immersing the respective monocrystal perovskite particle in functional layer growth mother liquor, and forming a first functional layer covering the entire surface of the respective monocrystal perovskite particle.

3. The method according to claim 2, wherein after forming the perovskite absorption layer, the method further includes:

removing the first functional layer on one or both of the first convex surface and the second convex surface of the respective monocrystal perovskite particle.

4. The method according to claim 3, wherein after removing the first functional layer on the first convex surface of the respective monocrystal perovskite particle, the method further includes:

forming a second functional layer on the first side of the perovskite absorption layer and the first convex surface of the respective monocrystal perovskite particle; and forming the first carrier transport layer includes: forming the first carrier transport layer over a surface of the second functional layer facing away from the perovskite absorption layer.

5. The method according to claim 3, wherein after removing the first functional layer on the second convex surface of the respective monocrystal perovskite particle, the method further includes:

forming a third functional layer on the second side of the perovskite absorption layer and the second convex surface of the respective monocrystal perovskite particle; and forming the second conductive layer includes: forming the second conductive layer over a surface of the third functional layer facing away from the perovskite absorption layer.

6. The method according to claim 1, wherein the functional layer is formed by:

after the perovskite absorption layer is formed, forming a fourth functional layer over a surface of the perovskite absorption layer facing away from the separation auxiliary layer and the first convex surfaces of the portion of the plurality of monocrystal perovskite particles; and forming the first carrier transport layer includes: forming the first carrier transport layer over a surface of the fourth functional layer facing away from the perovskite absorption layer;

or, the functional layer is formed by:

after the carrier plate and the separation auxiliary layer are removed, forming a fifth functional layer over a surface of the perovskite absorption layer facing away from the first carrier transport layer and the second convex surfaces of the portion of the plurality of monocrystal perovskite particles; and forming the second conductive layer includes: forming the second conductive layer over a surface of the fifth functional layer facing away from the perovskite absorption layer.

7. The method according to claim 1, further including:

forming a second carrier transport layer on the second side of the perovskite absorption layer after the carrier plate and the separation auxiliary layer are removed; and forming the second conductive layer includes: forming the second conductive layer over a surface of the second carrier transport layer facing away from the perovskite absorption layer.

8. A solar cell, comprising:

a second conductive layer, a perovskite absorption layer, a first carrier transport layer and a first conductive layer sequentially stacked in a first direction;

wherein the perovskite absorption layer has a first side facing the first carrier transport layer and a second side opposite to the first side and facing the second conductive layer, and includes a bonding matrix and a plurality of monocrystal perovskite particles arranged in the bonding matrix, at least some of the plurality of monocrystal perovskite particles have respective first convex surfaces protruding from the bonding matrix on the first side of the perovskite absorption layer and respective second convex surfaces protruding from the bonding matrix on the second side of the perovskite absorption layer, and a functional layer is formed on a surface of a respective monocrystal perovskite particle of a portion of the plurality of monocrystal perovskite particles.

9. The solar cell according to claim 8, wherein the functional layer includes any one of:

a first functional layer covering the entire surface of the respective monocrystal perovskite particle;

a second functional layer covering a remaining surface of the respective monocrystal perovskite particle other than the first convex surface;

a third functional layer covering a remaining surface of the respective monocrystal perovskite particle other than the second convex surface;

a fourth functional layer covering a remaining surface of the respective monocrystal perovskite particle other than the first convex surface and the second convex surface;

a fifth functional layer covering the first convex surfaces of the portion of the plurality of monocrystal perovskite particles and a surface on the first side of the perovskite absorption layer; and a sixth functional layer covering the second convex surfaces of the portion of the plurality of monocrystal perovskite particles and a surface on the second side of the perovskite absorption layer.

10. The solar cell according to claim 8, wherein the functional layer has a thickness in a range of 0.1 nm to 1 μm.

11. The solar cell according to claim 8, wherein for any one of the plurality of monocrystal perovskite particles, a distance between a respective monocrystal perovskite particle and an adjacent monocrystal perovskite particle is not greater than a maximum distance between any two points on a surface of the respective monocrystal perovskite particle.

12. The solar cell according to claim 8, wherein a maximum distance between any two points on the surface of a respective monocrystal perovskite particle of the plurality of monocrystal perovskite particles is in a range of 5 μm to 100 μm.

13. The solar cell according to claim 8, wherein an area of an orthographic projection of the perovskite absorption layer on the first conductive layer is a first area, an area of an orthographic projection of the plurality of monocrystal perovskite particles on the first conductive layer is a second area, and a ratio of the second area to the first area is in a range of 0.3 to 0.9.

14. The solar cell according to claim 8, wherein a distance between any point on the first convex surface and a surface on the first side of the perovskite absorption layer in the first direction is not greater than half of a maximum length of a respective monocrystal perovskite particle of the plurality of monocrystal perovskite particles in the first direction; and/or a distance between any point on the second convex surface and a surface on the second side of the perovskite absorption layer in the first direction is not greater than half of the maximum length of a respective monocrystal perovskite particle of the plurality of monocrystal perovskite particles in the first direction.

15. The solar cell according to claim 8, wherein the bonding matrix has a thickness not less than 100 nm in the first direction.

16. The solar cell according to claim 8, wherein the bonding matrix includes a light trapping surface facing the first carrier transport layer and/or facing the second conductive layer.

17. The solar cell according to claim 16, wherein the light trapping surface includes one or both of a first light trapping structure, extending in the first direction to the outside of the bonding matrix; and a second light trapping structure, recessed in the first direction to the inside of the bonding matrix.

18. The solar cell according to claim 8, wherein the first carrier transport layer is an electron transport layer or a hole transport layer.

19. The solar cell according to claim 8, further including: a second carrier transport layer, located between the perovskite absorption layer and the second conductive layer and in contact with the perovskite absorption layer and the second conductive layer respectively.

20. A tandem solar cell, comprising: a top cell, a bonding layer, and a bottom cell stacked in sequence, wherein the top cell is the solar cell according to claim 8.

* * * * *